US009184371B2

(12) United States Patent
Harigai et al.

(10) Patent No.: US 9,184,371 B2
(45) Date of Patent: Nov. 10, 2015

(54) PIEZOELECTRIC THIN FILM, METHOD FOR MANUFACTURING SAME, INKJET HEAD, METHOD FOR FORMING IMAGE USING INKJET HEAD, ANGULAR VELOCITY SENSOR, METHOD FOR MEASURING ANGULAR VELOCITY USING ANGULAR VELOCITY SENSOR, PIEZOELECTRIC POWER GENERATION ELEMENT, AND METHOD FOR GENERATING POWER USING PIEZOELECTRIC POWER GENERATION ELEMENT

(71) Applicant: PANASONIC CORPORATION, Osaka (JP)

(72) Inventors: Takakiyo Harigai, Osaka (JP); Yoshiaki Tanaka, Nara (JP); Hideaki Adachi, Osaka (JP); Eiji Fujii, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 341 days.

(21) Appl. No.: 13/731,221

(22) Filed: Dec. 31, 2012

(65) Prior Publication Data
US 2013/0136951 A1 May 30, 2013

Related U.S. Application Data

(63) Continuation of application No. PCT/JP2011/006402, filed on Nov. 17, 2011.

(30) Foreign Application Priority Data

Feb. 3, 2011 (JP) .................................. 2011-021331

(51) Int. Cl.
H01L 41/00 (2013.01)
B41J 2/045 (2006.01)
(Continued)

(52) U.S. Cl.
CPC ........... *H01L 41/183* (2013.01); *B41J 2/14201* (2013.01); *B41J 2/14233* (2013.01);
(Continued)

(58) Field of Classification Search
CPC ............... G01C 19/5769; G01C 19/56; G01C 19/5628; G01C 19/5607; G01C 19/5642; H01L 41/187; H01L 41/081; H01L 41/319; H01L 41/0478; H01L 41/113; H01L 41/316; H01L 41/0477; C04B 35/4682; C04B 35/6262; C04B 35/462; C04B 35/468; C04B 35/475; C23C 14/08; B41J 2/161; B41J 2/1623; B41J 2/1628; B41J 2/1631; B41J 2/1632; B41J 2/1642
USPC ............... 73/504.12, 504.14, 504.16, 504.02, 73/504.04; 310/367, 358, 365, 311, 319, 310/339, 363; 347/70, 71, 72, 68
See application file for complete search history.

(56) References Cited

U.S. PATENT DOCUMENTS 7,837,305 B2 * 11/2010 Hara et al. ...................... 347/70
8,020,974 B2 * 9/2011 Hara et al. ...................... 347/70
(Continued)

FOREIGN PATENT DOCUMENTS

CN 101020608 A 8/2007
JP 2001-048642 A 2/2001
(Continued)

OTHER PUBLICATIONS

"Orientation dependence of electrical properties of 0.09Na0.5Bi0.5TiO3-0.4BaTiO3 lead-free piezoelectric single crystal", Ge et al., Applied Physics A Material Science and Processing, pp. 761 to 767, Dec. 2, 2008.*

(Continued)

*Primary Examiner* — Helen Kwok
(74) *Attorney, Agent, or Firm* — McDermott Will & Emery LLP

(57) ABSTRACT

Provided is a piezoelectric thin film including a non-lead-containing (that is, lead-free) ferroelectric material and having high piezoelectric performance comparable to that of PZT, and a method of manufacturing the piezoelectric thin film. The piezoelectric film according to the present invention comprises a laminate structure. The laminate structure comprises an electric film and a $(1-x)(Na,Bi)TiO_3-xBaTiO_3$ film. x represents a value of not less than 0.03 and not more than 0.15. The $(1-x)(Na,Bi)TiO_3-xBaTiO_3$ film has a (110) surface orientation only. The $(1-x)(Na,Bi)TiO_3-xBaTiO_3$ film has an orthorhombic crystal structure only.

8 Claims, 18 Drawing Sheets

(51) Int. Cl.
*H01L 41/18* (2006.01)
*B41J 2/14* (2006.01)
*G01C 19/5621* (2012.01)
*H01L 41/09* (2006.01)
*H01L 41/187* (2006.01)
*C30B 29/32* (2006.01)
*C30B 29/68* (2006.01)
*H01L 41/113* (2006.01)
*H01L 41/08* (2006.01)
*H01L 41/314* (2013.01)

(52) U.S. Cl.
CPC ............... *C30B 29/32* (2013.01); *C30B 29/68* (2013.01); *G01C 19/5621* (2013.01); *H01L 41/0805* (2013.01); *H01L 41/0973* (2013.01); *H01L 41/113* (2013.01); *H01L 41/1132* (2013.01); *H01L 41/1873* (2013.01); *H01L 41/1878* (2013.01); *H01L 41/314* (2013.01); *B41J 2202/03* (2013.01)

(56) References Cited

U.S. PATENT DOCUMENTS

| | | | | |
|---|---|---|---|---|
| 8,727,506 | B2 * | 5/2014 | Harigai et al. | 347/68 |
| 2002/0014196 | A1 | 2/2002 | Takase et al. | |
| 2002/0098968 | A1 | 7/2002 | Takahashi et al. | |
| 2003/0001131 | A1 * | 1/2003 | Takase et al. | 252/62.9 R |
| 2003/0234835 | A1 * | 12/2003 | Torii et al. | 347/68 |
| 2004/0104981 | A1 * | 6/2004 | Fujii et al. | 347/71 |
| 2008/0024563 | A1 * | 1/2008 | Matsui et al. | 347/70 |
| 2010/0194245 | A1 | 8/2010 | Harigai et al. | |
| 2011/0072900 | A1 | 3/2011 | Harigai et al. | |
| 2011/0151566 | A1 * | 6/2011 | Hedrick et al. | 435/455 |
| 2014/0011051 | A1 * | 1/2014 | Harigai et al. | 428/701 |

FOREIGN PATENT DOCUMENTS

| | | |
|---|---|---|
| JP | 2001-151566 A | 6/2001 |
| JP | 2001-261435 A | 9/2001 |
| JP | 2002-160967 A | 6/2002 |
| JP | 2007-266346 A | 10/2007 |
| JP | 04-060073 B2 | 3/2008 |
| JP | 2010-067756 A | 3/2010 |
| WO | WO-2010/047049 A1 | 4/2010 |

OTHER PUBLICATIONS

"Piezoelectric Properties of Lead-Free (Na,Bi)TiO3-BaTiO3 (001) Epitaxial Thin Films around the Morphotropic Phase Boundary", Hargiai et al., Applied Physics Express, pp. 111501-1 to 111501-3, Sep. 1, 2010.*

Ke, Han "Preparation and Properties for Lead-free Na0.5Bi0.5TiO3-BaTiO3 Piezoelectric Ceramics: A Thesis Submitted in Partial of Fulfillment of the Requirements for the Degree of Master of Engineering" Huazhong University of Science & Technology; May 28, 2007; 27 pages with English translation.

International Search Report issued in International Patent Application No. PCT/JP2011/006402 dated Feb. 21, 2012.

Y. Guo et al., "Structure and electrical properties of trilayered $BaTiO_3/(Na_{0.5}Bi_{0.5})TiO_3\text{-}BaTiO_3/BaTiO_3$ thing films deposited on Si substrate," Solid State Communications 149 (2009) 14-17.

T. Takenaka et al., "Bi1/2Na1/2)TiO3-BaTiO3 System for Lead-Free Piezoelectric Ceramics," Japanese Journal of Applied Physics, vol. 30, No. 9B, Sep. 1991, pp. 2236-2239.

* cited by examiner

PIEZOELECTRIC THIN FILM, METHOD FOR MANUFACTURING SAME, INKJET HEAD, METHOD FOR FORMING IMAGE USING INKJET HEAD, ANGULAR VELOCITY SENSOR, METHOD FOR MEASURING ANGULAR VELOCITY USING ANGULAR VELOCITY SENSOR, PIEZOELECTRIC POWER GENERATION ELEMENT, AND METHOD FOR GENERATING POWER USING PIEZOELECTRIC POWER GENERATION ELEMENT

This is a continuation of International Application No. PCT/JP2011/006402, with an international filing date of Nov. 17, 2011, which claims priority of Japanese Patent Application No. 2011-021331, filed on Feb. 3, 2011, the contents of which are hereby incorporated by reference.

TECHNICAL FIELD

The present disclosure relates to a piezoelectric thin film including a piezoelectric layer and a method of manufacturing the same. The present invention further relates to an ink jet head including the piezoelectric thin film and a method of forming an image by the head, to an angular velocity sensor including the piezoelectric thin film and a method of measuring an angular velocity by the sensor, and to a piezoelectric generating element including the piezoelectric thin film and a method of generating electric power using the element.

BACKGROUND ART

Lead zirconate titanate (PZT: $Pb(Zr_yTi_{1-y})O_3$, $0<y<1$) is a typical ferroelectric material capable of storing a large amount of electric charge, and used in capacitors and thin film memories. PZT has pyroelectricity and piezoelectricity based on the ferroelectricity thereof. PZT has high piezoelectric performance, and its mechanical quality factor Qm can be controlled easily by adjusting the composition or adding an element thereto. This allows PZT to be applied to sensors, actuators, ultrasonic motors, filter circuits, and oscillators.

PZT, however, contains a large amount of lead. In recent years, there has been a growing concern that lead leached from waste may cause serious damage to the ecosystem and the environment. Accordingly, there has been an international movement toward restricting the use of lead. For this reason, lead-free ferroelectric materials, unlike PZT, have been in demand.

One of the lead-free ferroelectric materials that are currently under development is, for example, a perovskite-type composite oxide $[(Bi_{0.5}Na_{0.5})_{1-z}Ba_z]TiO_3$ made of bismuth (Bi), sodium (Na), barium (Ba), and titanium (Ti). Japan Patent Publication No. H04-60073B and T. Takenaka et al., Japanese Journal of Applied Physics, Vol. 30, No. 9B, (1991), pp. 2236-2239 disclose that this ferroelectric material exhibits high piezoelectric performance of about 125 pC/N in terms of a piezoelectric constant $d_{33}$, when the content of barium z (=[Ba/(Bi+Na+Ba)] is 5 to 10%. The piezoelectric performance of the ferroelectric material is, however, lower than that of PZT.

CITATION LIST

Patent Literature

PTL 1; Japanese Patent Publication No. H04-60073

Non Patent Literature

Non PTL 1; T. Takenaka et al., Japanese Journal of Applied Physics, Vol. 30, No. 9B, (1991), pp. 2236-2239

SUMMARY OF INVENTION

The piezoelectric film according to the present invention comprises a laminate structure, wherein
the laminate structure comprises an electric film and a $(1-x)(Na,Bi)TiO_3$-$xBaTiO_3$ film;
x represents a value of not less than 0.03 and not more than 0.15;
the $(1-x)(Na,Bi)TiO_3$-$xBaTiO_3$ film has a (110) surface orientation only; and
the $(1-x)(Na,Bi)TiO_3$-$xBaTiO_3$ film has an orthorhombic crystal structure only.

In one embodiment, the $(1-x)(Na,Bi)TiO_3$-$xBaTiO_3$ film contains manganese.

The ink jet head according to the present invention comprises:
a piezoelectric thin film having a piezoelectric layer sandwiched between a first electrode and a second electrode;
a vibration layer bonded to the piezoelectric thin film; and
a pressure chamber member having a pressure chamber for storing ink and bonded to a surface of the vibration layer opposite to a surface to which the piezoelectric thin film is bonded,
wherein the vibration layer is bonded to the piezoelectric thin film so that the vibration layer is displaceable in its film thickness direction according to a deformation of the piezoelectric thin film produced by a piezoelectric effect,
the vibration layer and the pressure chamber member are bonded to each other so that a volumetric capacity of the pressure chamber changes according to a displacement of the vibration layer and so that the ink in the pressure chamber is ejected according to a change in the volumetric capacity of the pressure chamber,
the piezoelectric layer is a $(1-x)(Na,Bi)TiO_3$-$xBaTiO_3$ film;
x represents a value of not less than 0.03 and not more than 0.15;
the $(1-x)(Na,Bi)TiO_3$-$xBaTiO_3$ film has a (110) surface orientation only; and
the $(1-x)(Na,Bi)TiO_3$-$xBaTiO_3$ film has an orthorhombic crystal structure only.

In one embodiment, the $(1-x)(Na,Bi)TiO_3$-$xBaTiO_3$ film contains manganese.

The method according to the present invention is a method of forming an image by an ink jet head, the method comprising steps of:
(a) preparing the ink jet head, wherein
the ink jet head includes: a piezoelectric thin film having a piezoelectric layer sandwiched between a first electrode and a second electrode; a vibration layer bonded to the piezoelectric thin film; and a pressure chamber member having a pressure chamber for storing ink and bonded to a surface of the vibration layer opposite to a surface to which the piezoelectric thin film is bonded,
the vibration layer is bonded to the piezoelectric thin film so that the vibration layer is displaceable in its film thickness direction according to a deformation of the piezoelectric thin film produced by a piezoelectric effect, the vibration layer and the pressure chamber member are bonded to each other so that a volumetric capacity of the pressure chamber changes according to a displacement of the vibration layer and so that the ink in the pressure chamber is ejected according to a change in the volumetric capacity of the pressure chamber, the piezoelectric layer is a $(1-x)(Na,Bi)TiO_3$-$xBaTiO_3$ film;

x represents a value of not less than 0.03 and not more than 0.15;

the $(1-x)(Na,Bi)TiO_3$-$xBaTiO_3$ film has a (110) surface orientation only; and the $(1-x)(Na,Bi)TiO_3$-$xBaTiO_3$ film has an orthorhombic crystal structure only; and (b) applying a voltage to the piezoelectric layer through the first electrode and the second electrode to displace, based on the piezoelectric effect, the vibration layer in its film thickness direction so that the volumetric capacity of the pressure chamber changes and the ink is ejected from the pressure chamber by the displacement.

In one embodiment, the $(1-x)(Na,Bi)TiO_3$-$xBaTiO_3$ film contains manganese.

The angular velocity sensor according to the present invention comprises:

a substrate having a vibration part; and a piezoelectric thin film bonded to the vibration part and having a piezoelectric layer sandwiched between a first electrode and a second electrode, wherein the piezoelectric layer is a $(1-x)(Na,Bi)TiO_3$-$xBaTiO_3$ film; x represents a value of not less than 0.03 and not more than 0.15; the $(1-x)(Na,Bi)TiO_3$-$xBaTiO_3$ film has a (110) surface orientation only;

the $(1-x)(Na,Bi)TiO_3$-$xBaTiO_3$ film has an orthorhombic crystal structure only; and one of the first electrode and the second electrode selected therefrom is composed of an electrode group including a drive electrode for applying a driving voltage that oscillates the vibration part to the piezoelectric layer and a sense electrode for measuring a deformation of the vibration part caused by an angular velocity applied to the oscillating vibration part.

In one embodiment, the $(1-x)(Na,Bi)TiO_3$-$xBaTiO_3$ film contains manganese.

The method according to the present invention is a method of measuring an angular velocity by an angular velocity sensor, the method comprising steps of:

(a) preparing the angular velocity sensor, wherein the angular velocity sensor includes: a substrate having a vibration part; and a piezoelectric thin film bonded to the vibration part and having a piezoelectric layer sandwiched between a first electrode and a second electrode, the piezoelectric layer is a $(1-x)(Na,Bi)TiO_3$-$xBaTiO_3$ film;

x represents a value of not less than 0.03 and not more than 0.15;

the $(1-x)(Na,Bi)TiO_3$-$xBaTiO_3$ film has a (110) surface orientation only;

the $(1-x)(Na,Bi)TiO_3$-$xBaTiO_3$ film has an orthorhombic crystal structure only; and one of the first electrode and the second electrode selected therefrom is composed of an electrode group including a drive electrode and a sense electrode;

(b) applying a driving voltage to the piezoelectric layer through the drive electrode and the other of the first electrode and the second electrode selected therefrom to oscillate the vibration part; and (c) measuring, through the other electrode and the sense electrode, a deformation of the vibration part caused by an angular velocity applied to the oscillating vibration part to obtain a value of the applied angular velocity.

In one embodiment, the $(1-x)(Na,Bi)TiO_3$-$xBaTiO_3$ film contains manganese.

The piezoelectric generating element according to the present invention comprises:

a substrate having a vibration part; and a piezoelectric thin film bonded to the vibration part and having a piezoelectric layer sandwiched between a first electrode and a second electrode, wherein the piezoelectric layer is a $(1-x)(Na,Bi)TiO_3$-$xBaTiO_3$ film;

x represents a value of not less than 0.03 and not more than 0.15;

the $(1-x)(Na,Bi)TiO_3$-$xBaTiO_3$ film has a (110) surface orientation only; and the $(1-x)(Na,Bi)TiO_3$-$xBaTiO_3$ film has an orthorhombic crystal structure only.

In one embodiment, the $(1-x)(Na,Bi)TiO_3$-$xBaTiO_3$ film contains manganese.

The method according to the present invention is a method of generating electric power using a piezoelectric generating element, the method comprising steps of:

(a) preparing the piezoelectric generating element, wherein the piezoelectric generating element includes: a substrate having a vibration part; and a piezoelectric thin film bonded to the vibration part and having a piezoelectric layer sandwiched between a first electrode and a second electrode, the piezoelectric layer is a $(1-x)(Na,Bi)TiO_3$-$xBaTiO_3$ film;

x represents a value of not less than 0.03 and not more than 0.15;

the $(1-x)(Na,Bi)TiO_3$-$xBaTiO_3$ film has a (110) surface orientation only; and the $(1-x)(Na,Bi)TiO_3$-$xBaTiO_3$ film has an orthorhombic crystal structure only; and (b) vibrating the vibration part to obtain electric power through the first electrode and the second electrode.

In one embodiment, the $(1-x)(Na,Bi)TiO_3$-$xBaTiO_3$ film contains manganese.

DESCRIPTION OF EMBODIMENTS

Figure 1A:
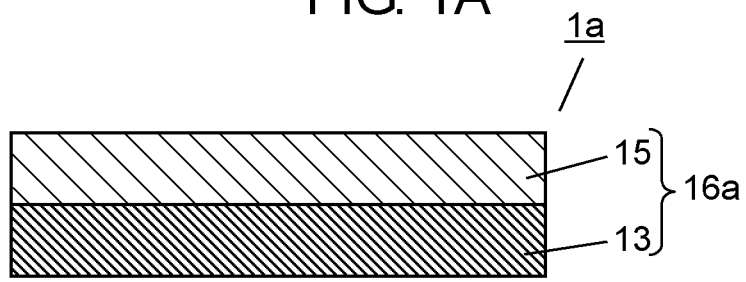
FIG. 1A is a cross-sectional view schematically showing an example of a piezoelectric thin film of the present invention.

Hereinafter, embodiments of the present invention will be described. In the following description, the same reference numerals are used to designate the same elements and parts, and therefore the overlapping description thereof can be omitted.

[Piezoelectric Thin Film and Method of Manufacturing Piezoelectric Thin Film]

FIG. 1A shows one embodiment of a piezoelectric thin film according to the present invention. A piezoelectric thin film $1a$ shown in FIG. 1A has a multilayer structure $16a$. The multilayer structure $16a$ has an electric film 13 and a (Na,Bi)TiO$_3$—BaTiO$_3$ film 15 in this order. These films 13 and 15 are laminated in contact with each other. The (Na,Bi)TiO$_3$—BaTiO$_3$ film 15 is a piezoelectric layer. The (Na,Bi)TiO$_3$—BaTiO$_3$ film 15 has a composition of $(1-x)(Na,Bi)TiO_3$-$xBaTiO_3$ (x represents not less than 0.03 and not more than 0.15) and an orthorhombic crystal structure. This allows the piezoelectric thin film $1a$ to have high piezoelectric performance comparable to that of PZT, although it contains no lead.

Examples of the electric films 13 are described below.

(1) a metal film such as a platinum (Pt) film, a palladium (Pd) film, an irridium (Ir) film, and a gold (Au) film, and (2) a conductive oxide film such as a nickel oxide (NiO) film, a ruthenium oxide (RuO$_2$) film, an iridium oxide (IrO$_2$) film, a strontium ruthenate (SrRuO$_3$) film, and a lanthanum-nickelate (LaNiO$_3$) film.

Two or more these films may be also used.

Among these films, a LaNiO$_3$ film 13 is preferred. The LaNiO$_3$ film 13 has a crystal structure represented by a chemical formula of $ABO_3$. The lattice constant of the crystal structure is 0.384 nm (pseudocubic). Accordingly, the $LaNiO_3$ film 13 has good lattice matching to the (Na,Bi)$TiO_3$—$BaTiO_3$ film 15.

The electrode film 13 may contain a small amount of impurities. The impurity is typically a rare-earth element, which substitutes for La.

The $LaNiO_3$ electrode film 13 is a conductive oxide. The electrode film 13 can serve as an electrode layer for applying a voltage to the (Na,Bi)$TiO_3$—$BaTiO_3$ film 15. A $SrRuO_3$ film, which has a perovskite structure, is preferred since it has good electric conductivity.

Typically, the electrode film 13 can be formed by sputtering. The electrode film 13 can be formed by other thin film formation techniques such as pulsed laser deposition (PLD), chemical vapor deposition (CVD), sol-gel processing, and aerosol deposition (AD).

In the piezoelectric thin film manufacturing method of the present invention, sputtering is used to form the electrode film 13 formed of Pt, $LaNiO_3$, or $SrRuO_3$.

The (Na,Bi)$TiO_3$—$BaTiO_3$ film 15 is formed on the electric film 13 by sputtering.

In the stoichiometric composition of (Na, Bi)$TiO_3$, the amounts of Na, Bi, Ti, and O are 0.5, 0.5, 1, and 3, respectively. However, the present invention is not limited to these values.

For example, even when the amount of Na is smaller than 0.5 (Na deficiency), even when the amount of Bi is larger than 0.5 (Bi excess), or even when both of the Na deficiency and the Bi excess are satisfied, the crystallinity of the piezoelectric film can be improved and an excellent piezoelectric property can be obtained.

The value of "3" which represents the oxygen amount in sodium bismuth titanate may include error. Even when the amounts of Na, Bi, and Ti are respectively 0.5, 0.5, and 1, the amount of 0 does not always agree with the value of "3". The amount of 0 tends to be less than 3 in the piezoelectric film. Similarly, the value of "3" which represents the oxygen amount in $BiTiO_3$ may include error.

The thickness of the (Na,Bi)$TiO_3$—$BaTiO_3$ film 15 is not limited. The thickness thereof is at least 0.5 micrometers but not more than 10 micrometers, for example. Although the (Na,Bi)$TiO_3$—$BaTiO_3$ film 15 is such a thin film, it has low dielectric loss and high piezoelectric performance.

The (Na,Bi)$TiO_3$—$BaTiO_3$ film 15 has a perovskite-type crystal structure represented by the chemical formula $ABO_3$. The A site and B site in the perovskite structure have average valences of 2 and 4, respectively, depending on the placement of a single element or a plurality of elements. The A site is Bi, Na, and Ba. The B site is Ti. The (Na,Bi)$TiO_3$—$BaTiO_3$ film 15 may contain a minute amount of impurities. The impurities typically are Li and K to substitute for Na, and Sr and Ca to substitute for Ba, in the A site. The impurity typically is Zr to substitute for Ti in the B site. Examples of the other impurities are Mn, Fe, Nb, and Ta. Some of these impurities can improve the crystallinity and piezoelectric performance of the (Na,Bi)$TiO_3$—$BaTiO_3$ film 15.

Another film may be interposed optionally between the electrode film 13 and the (Na,Bi)$TiO_3$—$BaTiO_3$ film 15. The film may be, for example, a Pt film, a $LaNiO_3$ film, or a $SrRuO_3$ film.

Typically, the (Na,Bi)$TiO_3$—$BaTiO_3$ film 15 can be formed by sputtering. The (Na,Bi)$TiO_3$—$BaTiO_3$ film 15 can be formed by other thin film formation techniques such as PLD, CVD, sol-gel processing, and AD as long as it has a (001) orientation.

Figure 1B:
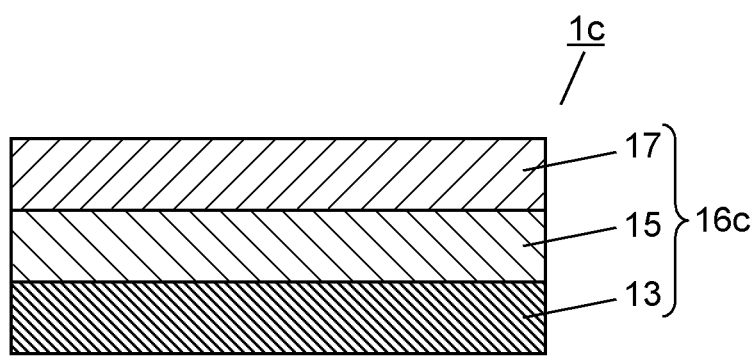
FIG. 1B is a cross-sectional view schematically showing another example of the piezoelectric thin film of the present invention.

FIG. 1B shows another embodiment of the piezoelectric thin film according to the present invention. A piezoelectric thin film 1c shown in FIG. 1B has a multilayer structure 16c. The multilayer structure 16c is a structure in which the multilayer structure 16a shown in FIG. 1A further includes a conductive film 17. The conductive film 17 is formed on the (Na,Bi)$TiO_3$—$BaTiO_3$ film 15. Particularly, the multilayer structure 16c has the electrode film 13, the (Na,Bi)$TiO_3$—$BaTiO_3$ film 15, and the conductive film 17 in this order. These films are laminated in contact with each other.

In the piezoelectric thin film 1c, the (Na,Bi)$TiO_3$—$BaTiO_3$ film 15 is interposed between the electrode film 13 and the conductive film 17. The electrode film 13 and the conductive film 17 can serve as an electrode layer for applying a voltage to the (Na,Bi)$TiO_3$—$BaTiO_3$ film 15, which is a piezoelectric layer.

The conductive layer 17 is composed of a conductive material. An example of the material is a metal having low electric resistant. The material may be a conductive oxide such as NiO, $RuO_2$, $IrO_3$, $SrRuO_3$, or $LaNiO_3$. The conductive film 17 may be composed of two or more these materials. An adhesive layer improving an adhesion between the conductive film 17 and the (Na,Bi)$TiO_3$—$BaTiO_3$ film 15 may be provided therebetween. An example of the material of the adhesive layer is titanium (Ti). The material may be tantalum (Ta), iron (Fe), cobalt (Co), nickel (Ni), chrome (Cr), or a compound thereof. The adhesive layer may be composed of two or more these materials. The adhesive layer may be omitted depending on the adhesion between the conductive film 17 and the (Na,Bi)$TiO_3$—$BaTiO_3$ film 15.

The piezoelectric thin film 1c shown in FIG. 1B can be manufactured by forming the (Na,Bi)$TiO_3$—$BaTiO_3$ film 15 and the conductive film 17 on the electrode film 13 in this order. The conductive film 17 can be formed by thin film formation techniques such as sputtering, PLD, CVD, sol-gel processing, or AD.

The present method of fabricating a piezoelectric thin film further comprises a step of forming the conductive film 17 on the (Na,Bi)$TiO_3$—$BaTiO_3$ film 15. Thus, the piezoelectric thin film 1c shown in FIG. 1B can be fabricated.

Figure 1C:
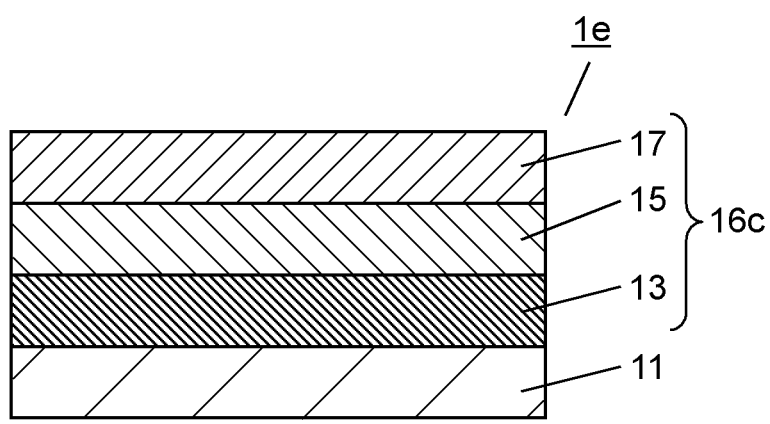
FIG. 1C is a cross-sectional view schematically showing still another example of the piezoelectric thin film of the present invention.

The piezoelectric thin film according to the present invention further comprises a substrate 11 as shown in FIG. 1C. The electrode film 13 is formed on the substrate.

In the piezoelectric thin film 1e shown in FIG. 1C, the multilayer structure 16c shown in FIG. 1B is formed on the substrate 11.

The substrate 11 may be a silicon (Si) substrate or a MgO substrate. A Si monocrystalline substrate is preferred.

An adhesive layer improving an adhesion between the substrate 11 and the multilayer structure 16c (more particularly, between the substrate 11 and the electrode film 13) may be provided therebetween. However, the adhesive layer is required to be conductive. An example of the material of the adhesive layer is titanium (Ti). The material may be tantalum (Ta), iron (Fe), cobalt (Co), nickel (Ni), chrome (Cr), or a compound thereof. The adhesive layer may be composed of two or more these materials. The adhesive layer may be omitted depending on the adhesion between the substrate 11 and the multilayer structure 16c.

The piezoelectric thin film 1e shown in FIG. 1C can be fabricated by forming the electrode film 13, the (Na,Bi)$TiO_3$—$BaTiO_3$ film 15, and the conductive film 17 on the substrate 11 in this order.

The present method of fabricating the piezoelectric thin film may comprise a step of forming the electrode film 13 on the substrate 11.

The piezoelectric thin films 1a to 1e shown in FIG. 1A to FIG. 1C may be fabricated with use of an base substrate. Particularly, one of the multilayer structures 16a to 16c may be formed on the base substrate to remove the base substrate. Thus, the piezoelectric thin films 1a to 1e may be fabricated. The base substrate may be removed by a known method such as etching.

The piezoelectric thin film 1e shown in FIG. 1C may be also fabricated with use of an base substrate. In one specific embodiment, the base substrate doubles as the substrate 11. After the multilayer structure 16c may be formed on the base substrate, the base substrate 16c is removed. Subsequently, the base substrate 16d may be disposed on the substrate 11 which is prepared separately. Thus, the piezoelectric thin film 1e may be fabricated.

The base substrate can be one of the following substrates: a substrate made of an oxide having a NaCl structure, such as MgO; a substrate made of an oxide having a perovskite structure, such as $SrTiO_3$, $LaAlO_3$, and $NdGaO_3$; a substrate made of an oxide having a corundum structure, such as $Al_2O_3$; a substrate made of an oxide having a spinel structure, such as $MgAl_2O_4$; a substrate made of an oxide having a rutile structure, such as $TiO_2$; and a substrate made of an oxide having a cubic crystal structure, such as $(La,Sr)(Al,Ta)O_3$, and yttria-stabilized zirconia (YSZ). The base substrate can be formed by laminating an oxide thin film having a NaCl type crystal structure on the surface of a glass substrate, a ceramic substrate such as an alumina substrate, or a metal substrate such as a stainless steel substrate. In this case, the electrode film 13 can be formed on the surface of the oxide thin film. Examples of the oxide thin film include a MgO thin film, a NiO thin film, and a cobalt oxide (CoO) thin film.

As described above, the present method of the fabricating the piezoelectric thin film may comprise a step of the electrode film 13 on the base substrate directly or via another film. After the base substrate which doubles as the substrate 11 is removed, another substrate is disposed. The another substrate is in contact with the electrode film 13. The another substrate may be disposed so that the another substrate is in contact with the $(Na,Bi)TiO_3$—$BaTiO_3$ film 15. In the latter case, a piezoelectric thin film where the $(Na,Bi)TiO_3$—$BaTiO_3$ film 15, and the electrode film 13 are formed on the another substrate in this order is obtained.

[Ink Jet Head]

An ink jet head of the present invention will be described with reference to FIG. 2 to FIG. 12B.

Figure 2:
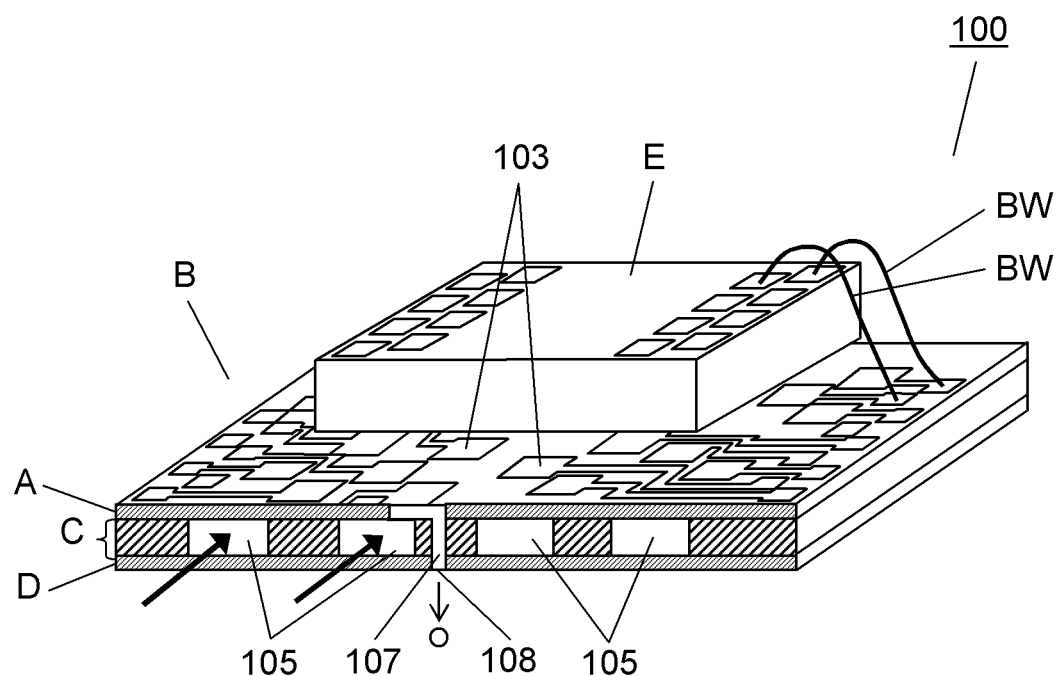
FIG. 2 is a perspective view schematically showing an example of an ink jet head of the present invention and partially showing a cross section of the ink jet head.
Figure 3:
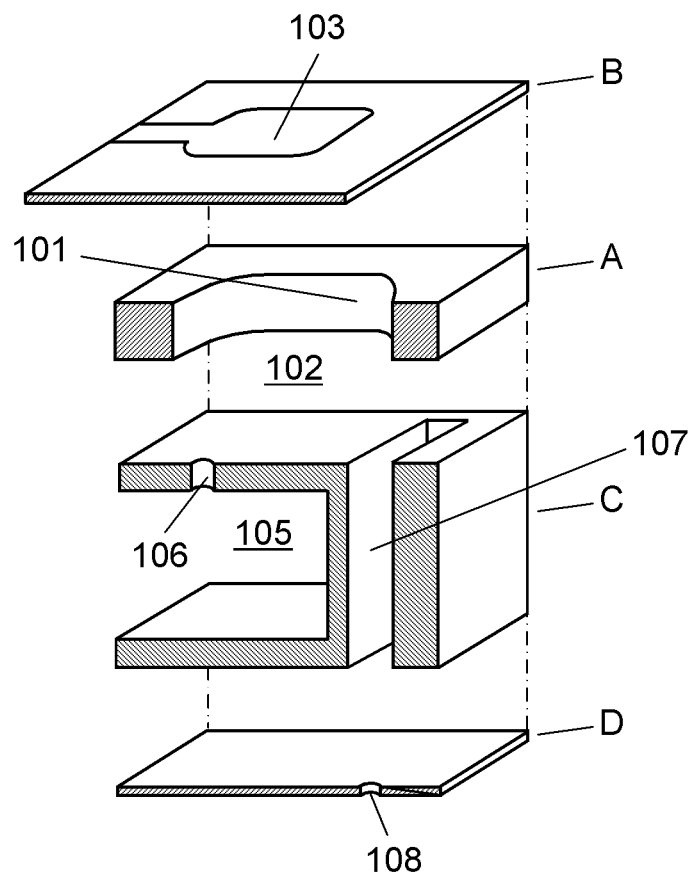
FIG. 3 is an exploded perspective view schematically showing main parts including a pressure chamber member and an actuator part in the ink jet head shown in FIG. 2 and partially showing a cross section of the main parts.

FIG. 2 shows an example of the ink jet head of the present invention. FIG. 3 is an exploded view showing main parts including a pressure chamber member and an actuator part in an ink jet head 100 shown in FIG. 2.

A reference character A in FIG. 2 and FIG. 3 indicates a pressure chamber member. The pressure chamber member A includes through-holes 101 that penetrate therethrough in its thickness direction (in the upward and downward directions in these diagrams). The through-hole 101 shown in FIG. 3 is a part of the through-hole 101 in the cross section in the thickness direction of the pressure chamber member A. A reference character B indicates an actuator part including piezoelectric thin films and vibration layers. A reference character C indicates an ink passage member C including common liquid chambers 105 and ink passages 107. The pressure chamber member A, the actuator part B, and the ink passage member C are bonded to each other so that the pressure chamber member A is sandwiched between the actuator part B and the ink passage member C. When the pressure chamber member A, the actuator part B, and the ink passage member C are bonded to each other, each of the through-holes 101 forms a pressure chamber 102 for storing ink supplied from the common liquid chamber 105.

The actuator part B has piezoelectric thin films and vibration layers that are aligned over the corresponding pressure chambers 102 respectively in plan view. In FIG. 2 and FIG. 3, a reference numeral 103 indicates an individual electrode layer that is a part of the piezoelectric thin film. As shown in FIG. 2, in the ink jet head 100, a plurality of individual electrode layers 103 are arranged in a zigzag pattern in plan view.

The ink passage member C has a plurality of common liquid chambers 105 arranged in stripes in plan view. In FIG. 2 and FIG. 3, each of the common liquid chambers 105 is aligned over a plurality of pressure chambers 102 in plan view. The common liquid chambers 105 extend in the ink supply direction (in the direction indicated by arrows in FIG. 2) in the ink jet head 100. The ink passage member C has supply ports 106, each of which supplies the ink in the common liquid chamber 105 to one of the pressure chambers 102, and ink passages 107, each of which ejects the ink in the corresponding pressure chamber 102 through the corresponding nozzle hole 108. Usually, one pressure chamber 102 has one supply port 106 and one nozzle hole 108. The nozzle holes 108 are formed in a nozzle plate D. The nozzle plate D is bonded to the ink passage member C so that the nozzle plate D and the pressure chamber member A sandwich the ink passage member C therebetween.

In FIG. 2, a reference character E indicates an IC chip. The IC chip E is connected electrically to the individual electrode layers 103, which are exposed on the surface of the actuator part B, through bonding wires BW. For simplicity of FIG. 2, only a part of the bonding wires BW are shown in FIG. 2.

Figure 4A:
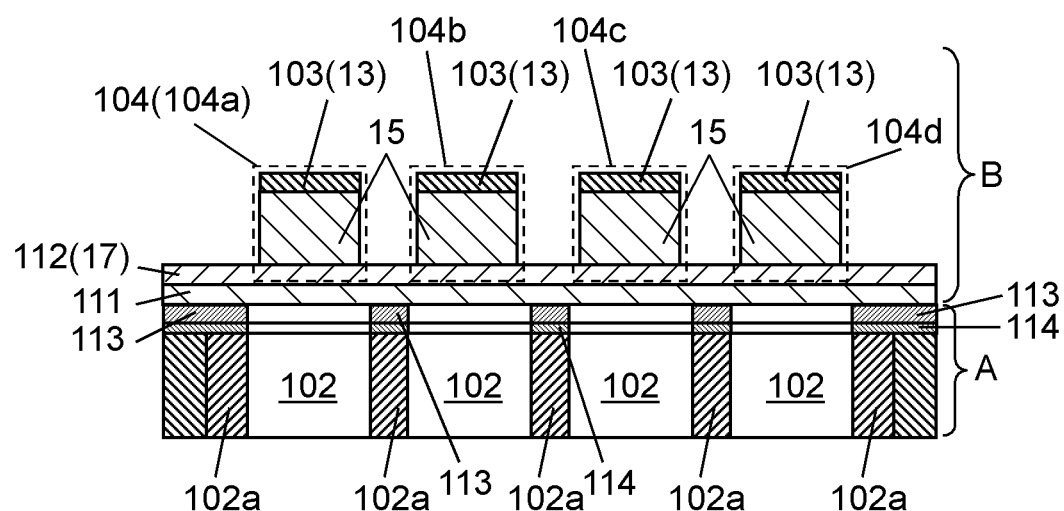
FIG. 4A is a cross-sectional view schematically showing an example of the main parts including the pressure chamber member and the actuator part in the ink jet head shown in FIG. 2.
Figure 4B:
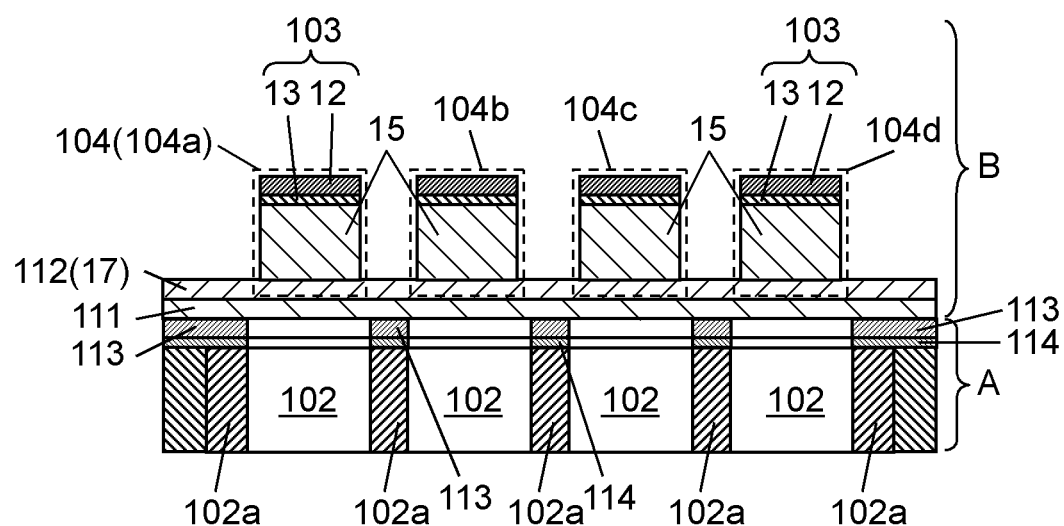
FIG. 4B is a cross-sectional view schematically showing another example of the main parts including the pressure chamber member and the actuator part in the ink jet head shown in FIG. 2.

FIG. 4A and FIG. 4B show the configuration of the main parts including the pressure chamber member A and the actuator part B. FIG. 4A and FIG. 4B show the cross section perpendicular to the ink supply direction (in the direction indicated by the arrows in FIG. 2) in the pressure chamber member A and the actuator part B. The actuator part B includes piezoelectric thin films 104 (104a to 104d) each having the piezoelectric layer 15 sandwiched between the first electrode (individual electrode layer 103) and the second electrode (common electrode layer 112). The individual electrode layers 103 correspond one to one to the piezoelectric thin films 104a to 104d. The common electrode layer 112 is a single layer electrode that is common to the piezoelectric thin films 104a to 104d.

The piezoelectric thin films 104 shown in FIG. 4A has the multilayer structure 16c shown in FIG. 1C. This structure has the electrode film 13 that is the individual electrode layer 103, the piezoelectric layer 15 which is a piezoelectric layer, and the common electrode layer 112 in this order from the side of the electrode film 13.

The piezoelectric thin films 104 shown in FIG. 4B has the multilayer structure 16d shown in FIG. 1D. This structure has the metal electrode film 12 and the electrode film 13 that serve as the individual electrode layer 103, the piezoelectric layer 15, and the conductive film 17 which is the common electrode layer 112.

The metal electrode film 12, the electrode film 13, the piezoelectric layer 15, and the conductive film 17 in each of the piezoelectric thin films 104 shown in FIG. 4A and FIG. 4B are the same as those in the piezoelectric thin film of the present invention that has been described above, including the preferred embodiments thereof.

The conductive film 17 which is the common electrode layer 112 may be a Pt film having an adhesive layer consisting of a conductive material on its surface. Preferably, the conductive material is Ti, since Ti has high adhesion to the (Na,Bi)TiO$_3$—BaTiO$_3$ film 15 and may serve desirably as an adhesive layer between the piezoelectric layer and the common electrode layer.

Both of the first electrode and the second electrode can be the individual electrode layers as long as a voltage applied between the first electrode and the second electrode can induce a deformation of the piezoelectric layer 15. That is, the piezoelectric thin film in the ink jet head of the present invention can include the common electrode layer 112, the piezoelectric layer 15 which is a piezoelectric layer, and the individual electrode layer 103 in this order. In this case, the common electrode layer 112 that is the first electrode is composed of the electrode film 13. The individual electrode layer 103 is consisted of the conductive layer 17.

Preferably, the individual electrode layer 103 has a thickness of at least 0.05 micrometers but not more than 1 micrometer. It is preferable that the piezoelectric layer 15 have a thickness of at least 0.5 micrometers but not more than 5 micrometers. It is preferable that the common electrode layer 112 have a thickness of at least 0.05 micrometers but not more than 0.5 micrometers.

The actuator part B further includes a vibration layer 111 that is bonded to the common electrode layer 112 of the piezoelectric thin film 104. The vibration layer 111 is displaced in its film thickness direction according to a deformation of the piezoelectric thin film 104 produced by a piezoelectric effect. A voltage application to the piezoelectric layer 15 through the individual electrode layer 103 and the common electrode layer 112 brings about a deformation of the piezoelectric thin film 104 produced by the piezoelectric effect.

The pressure chamber member A is bonded to the vibration layer 111 via the intermediate layer 113 and the adhesive layer 114. The pressure chamber member A and the piezoelectric thin film 104 sandwich the vibration layer 111 therebetween.

The structure of the vibration layer 111, the bonding state of the piezoelectric thin film 104 and the vibration layer 111, and the bonding state of the vibration layer 111 and the pressure chamber member A are not limited as long as
(1) the vibration layer 111 is displaceable according to a deformation of the piezoelectric thin film 104 produced by the piezoelectric effect,
(2) the volumetric capacity of the pressure chamber 102 changes according to a displacement of the vibration layer 111, and
(3) the ink in the pressure chamber 102 is ejected according to a change in the volumetric capacity of the pressure chamber 102. In FIG. 4A and FIG. 4B, the vibration layer 111 forms a wall of the pressure chamber 102.

The vibration layer 111 is composed, for example, of a Cr film. The vibration layer 111 can be composed of a film made of Ni, aluminum (Al), tantalum (Ta), tungsten (W), or silicon (Si), or of an oxide or nitride thereof (for example, silicon dioxide, aluminum oxide, zirconium oxide, or silicon nitride). Preferably, the vibration layer 111 has a thickness of at least 2 micrometers but not more than 5 micrometers.

The adhesive layer 114 is made of an adhesive or a glue. A person skilled in the art can select an appropriate type of the adhesive or the glue.

The intermediate layer (longitudinal wall) 113 prevents the adhesive layer 114 from adhering to a portion of the vibration layer 111 exposed to the pressure chamber 102 when the pressure chamber member A is bonded to the vibration layer 111 via the adhesive layer 114. The adhesive that has adhered to the portion inhibits the displacement of the vibration layer 111. The material for the intermediate layer 113 is not limited as long as the functions of the ink jet head 100 are maintained. An example of the material for the intermediate layer 113 is Ti. The intermediate layer 113 can be omitted.

The pressure chamber member A has partition walls 102a between adjacent pressure chambers 102.

An example of the method of manufacturing the ink jet head 100 shown in FIG. 2 is described with reference to FIG. 5A to FIG. 10.

Figure 5A:
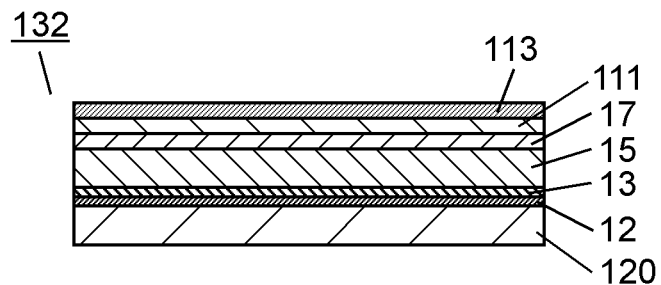
FIG. 5A is a cross-sectional view schematically showing a step of forming a laminate including a piezoelectric layer in an example of a method of manufacturing the ink jet head shown in FIG. 2.

First, as shown in FIG. 5A, the electrode film 13, the (Na,Bi)TiO$_3$—BaTiO$_3$ film 15, the common electrode layer 112, the vibration layer 111, and the intermediate layer 113 are formed in this order on the base substrate 120 to obtain a laminate 132. A thin film formation technique for forming the respective layers (and films) is not particularly limited. Examples of the thin film formation technique include PLD, CVD, sol-gel processing, and AD. Sputtering is preferably used as the technique.

Figure 5B:
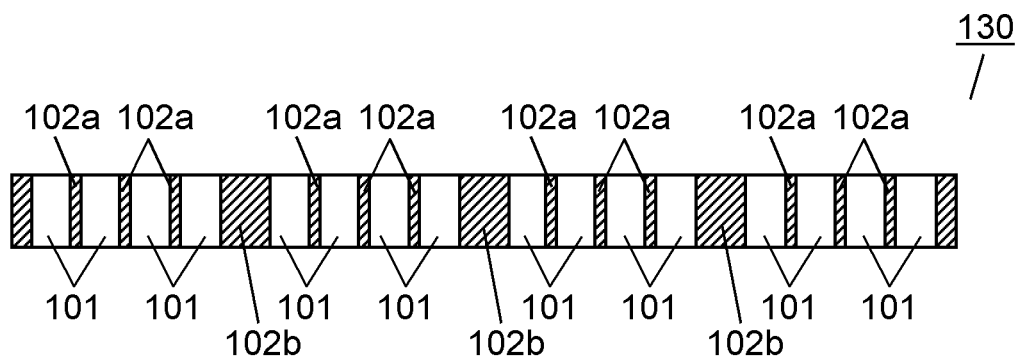
FIG. 5B is a cross-sectional view schematically showing a step of forming a member, which serves as the pressure chamber member later, in the example of the method of manufacturing the ink jet head shown in FIG. 2.

Apart from the formation of the laminate 132, a member, which serves as the pressure chamber member A later, is formed. This member is formed, for example, by microfabricating a Si substrate (preferably, a monocrystalline Si substrate). It is preferable that the Si substrate be larger in size than the base substrate 120 (see FIG. 10). More particularly, as shown in FIG. 5B, a plurality of through-holes 101 are formed in the substrate 130. The through-holes 101 serve as the pressure chambers 102 after this member is bonded to the separately formed actuator part and ink passage member. In FIG. 5B, one through-hole group consists of four through-holes 101, and the substrate 130 includes a plurality of through-hole groups. A first partition wall 102a is a partition of adjacent two through-holes 101 belonging to one through-hole group. A second partition wall 102b is a partition of adjacent two through-hole groups. Preferably, the thickness of the second partition wall 102b is at least twice as large as that of the first partition wall 102a. The through-hole 101 can be provided in the substrate 130 by well-known microfabrication techniques, for example, a combination of patterning and etching. The shape of the through-hole 101 can be conformed to a desired shape of the pressure chamber 102. Hereinafter, the first partition walls 102a and the second partition walls 102b are referred to as partition walls 102 collectively.

Figure 5C:
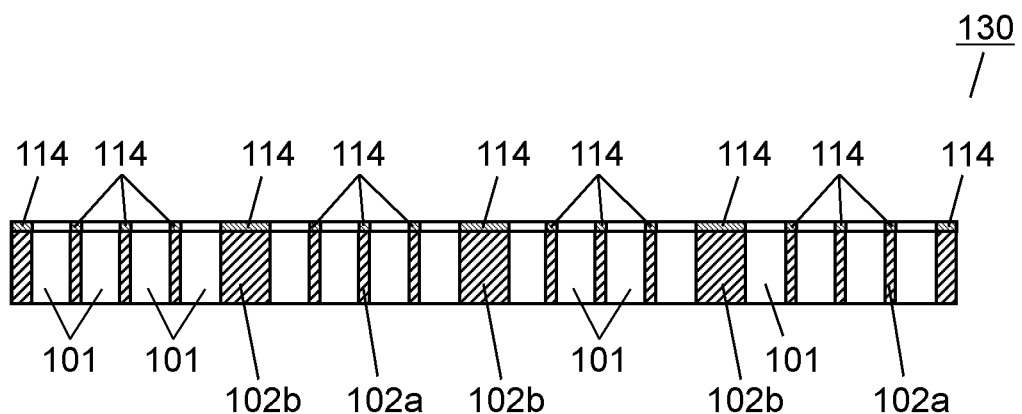
FIG. 5C is a cross-sectional view schematically showing a step of forming an adhesive layer in the example of the method of manufacturing the ink jet head shown in FIG. 2.

Next, as shown in FIG. 5C, the adhesive layer 114 is formed on the partition wall 102. The formation method of the adhesive layer 114 is not limited. An example of the method is electrodeposition.

Figure 6A:
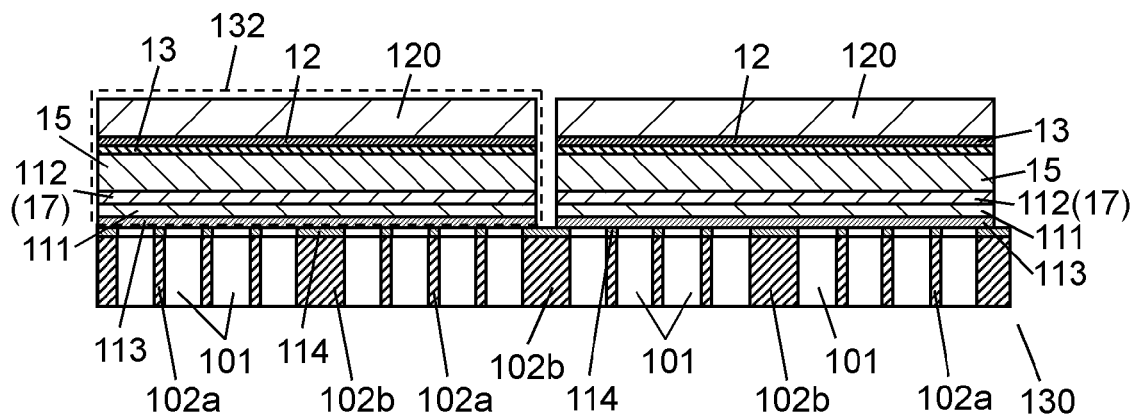
FIG. 6A is a cross-sectional view schematically showing a step of bonding the laminate formed in the step shown in FIG. 5A and the member formed in the step shown in FIG. 5B, in the example of the method of manufacturing the ink jet head shown in FIG. 2.
Figure 10:
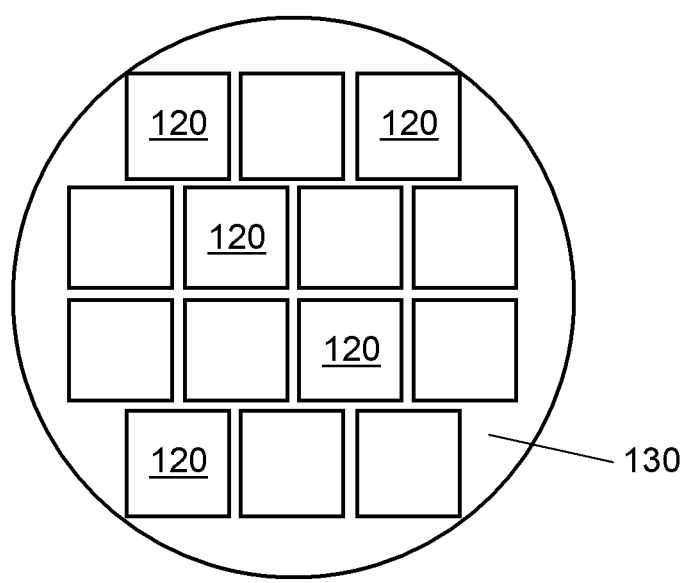
FIG. 10 is a plan view schematically showing an example of an arrangement in which a laminate serving later as the actuator part is placed on a substrate serving later as the pressure chamber member.

Then, as shown in FIG. 6A, the substrate 130 is bonded to the laminate 132. The intermediate layer 113 is sandwiched between the substrate 130 and the laminate 132. When the substrate 130 is larger in size than the base substrate 120, a plurality of laminates 132 (14 laminates in the example shown in FIG. 10) can be bonded to the substrate 130, as shown in FIG. 10. In FIG. 6A, two laminates 132 are bonded to the substrate 130. In FIG. 6A, the center of each of the two laminates 132 is positioned on the extension of the second partition wall 102b. After the substrate 130 is joined to the laminate 132, the conductive layer 17 becomes the common electrode layer 112.

When a thermosetting adhesive is used as the adhesive layer 114, it is preferable that after the substrate 130 is bonded to the laminate 132, heat be applied to cure the adhesive layer 114 completely. The adhesive layer 114 that has spread into the through-hole 101 during the bonding can be removed by plasma treatment.

Figure 6B:
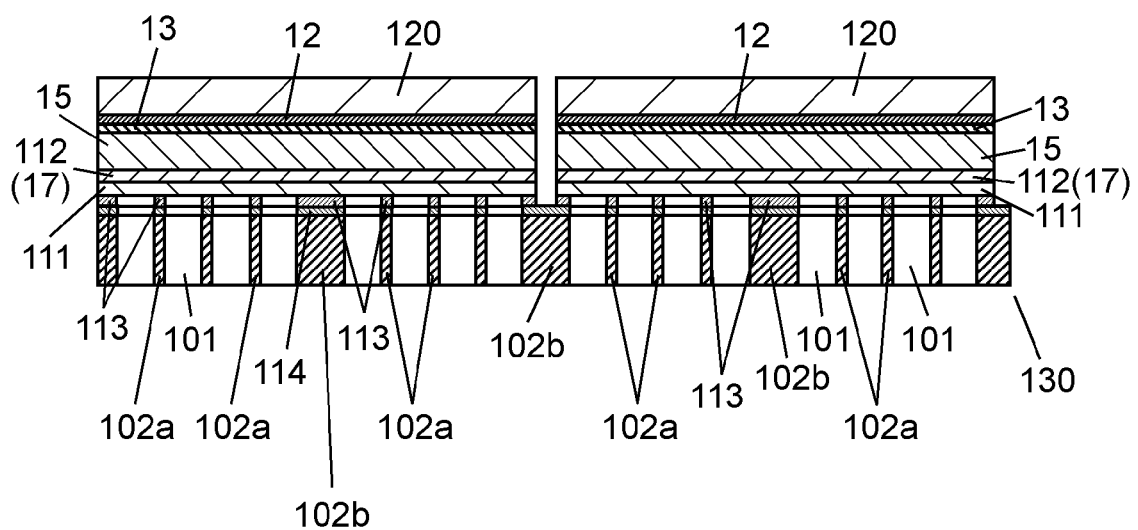
FIG. 6B is a cross-sectional view schematically showing a step (a step of etching an intermediate layer) following the step shown in FIG. 6A in the example of the method of manufacturing the ink jet head shown in FIG. 2.

Next, as shown in FIG. 6B, the intermediate layer 113 is etched into the cross-sectional shape of the through-holes 101 by using the partition walls 102 as a mask. Thus, the vibration layer 111 is exposed to the through-holes 101. This etching transforms the shape of the intermediate layer 113 into the same shape as the partition walls 102 in plan view. The intermediate layer 113 as well as the partition wall 102 and the adhesion layer 114 form a longitudinal wall. In this manner, the pressure chamber member A including the substrate 130, the intermediate layer 113, and the adhesive layer 114 is formed.

In the example shown in FIG. 5B to FIG. 6B, the substrate 130 in which the through-holes 101 are formed is bonded to the laminates 132 including the piezoelectric layers 15. The pressure chamber member A also can be formed, instead of the above procedure, by bonding the substrate 130 having no through-hole 101 to the laminates 132 and then forming the through-holes 101 in the substrate 130 to expose the vibration layer 111.

Figure 7A:
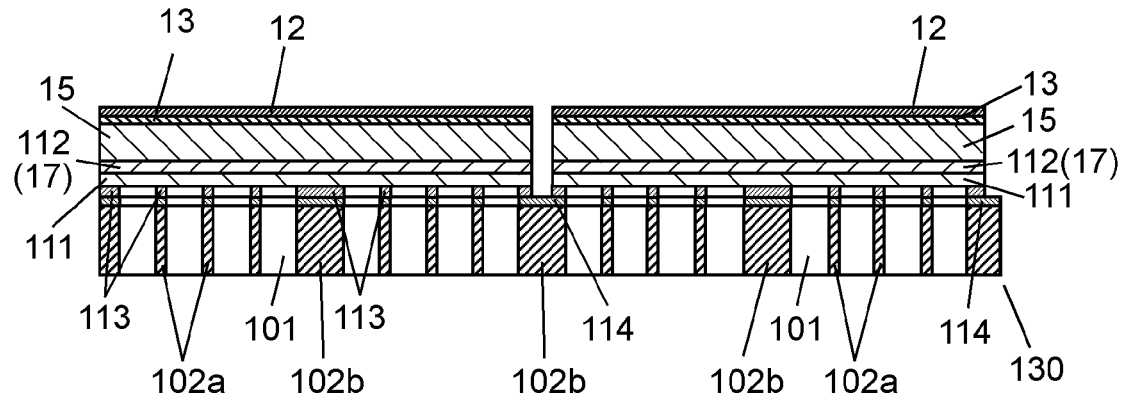
FIG. 7A is a cross-sectional view schematically showing a step (a step of removing a base substrate) following the step shown in FIG. 6B in the example of the method of manufacturing the ink jet head shown in FIG. 2.

Then, as shown in FIG. 7A, the base substrate 120 is removed by, for example, etching.

Figure 7B:
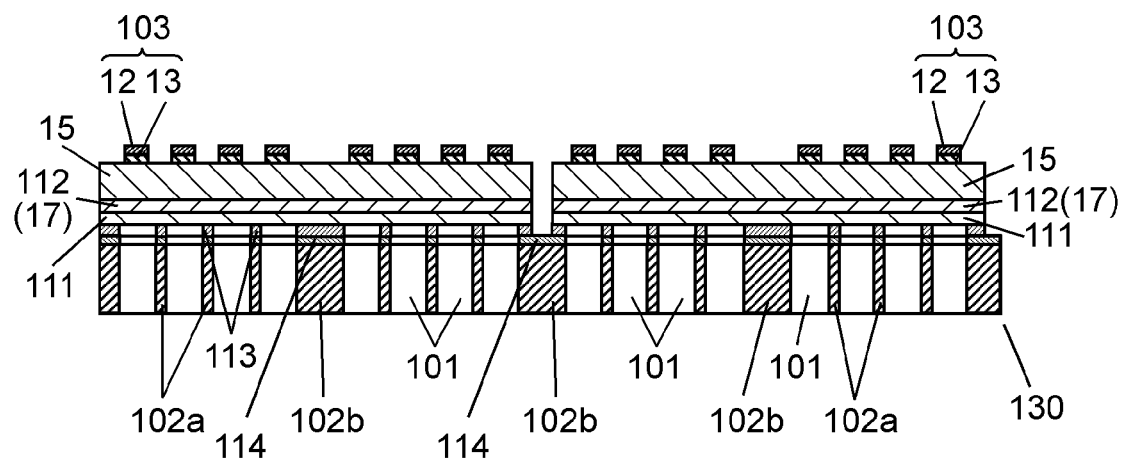
FIG. 7B is a cross-sectional view schematically showing a step (a step of forming an individual electrode layer) following the step shown in FIG. 7A in the example of the method of manufacturing the ink jet head shown in FIG. 2.

Next, as shown in FIG. 7B, the electric film 13 is transformed into a plurality of individual electrode layers 103 by a combination of microfabrications of photolithography and etching. The individual electrode layers 103 correspond one to one to the through-holes 101 in plan view.

Figure 8A:
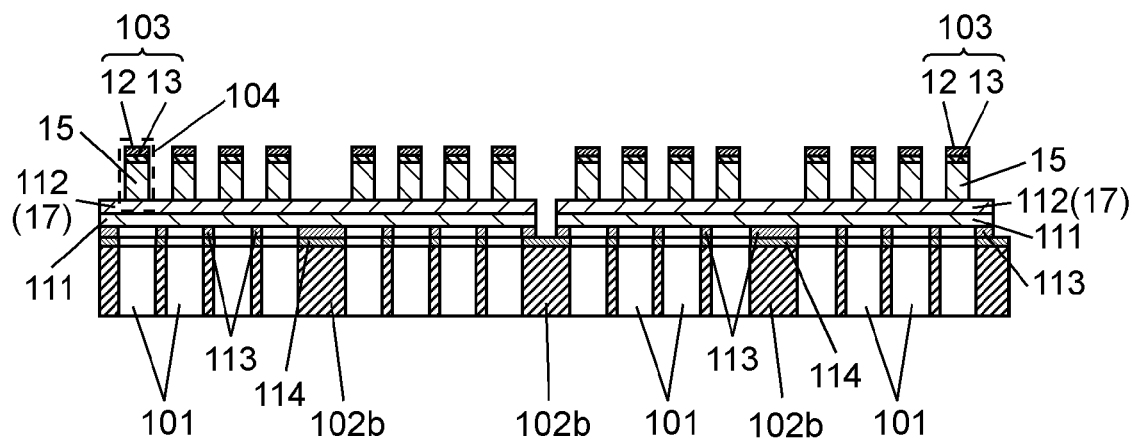
FIG. 8A is a cross-sectional view schematically showing a step (a step of microfabricating the piezoelectric layer) following the step shown in FIG. 7B in the example of the method of manufacturing the ink jet head shown in FIG. 2.

Then, as shown in FIG. 8A, the $(Na,Bi)TiO_3$—$BaTiO_3$ film 15 are subjected to microfabrication. The $(Na,Bi)TiO_3$—$BaTiO_3$ film 15 have the same shape as the individual electrode layer 103 in plan view. It is preferable that in this microfabrication, the center of the respective layers (and films) coincide with the center of the through-hole 101 with high accuracy in plan view. In this manner, the actuator part B including the vibration layers 111, and the piezoelectric thin films 104 each composed of the individual electrode layer 103 (the electrode film 13), the $(Na,Bi)TiO_3$—$BaTiO_3$ film 15, and the common electrode layer 112, is formed.

Figure 8B:
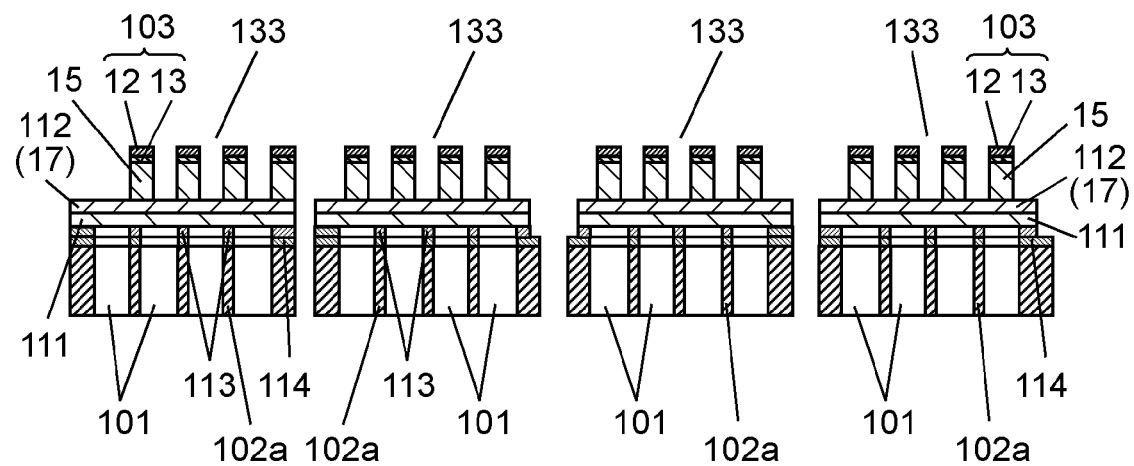
FIG. 8B is a cross-sectional view schematically showing a step (a step of cutting the substrate) following the step shown in FIG. 8A in the example of the method of manufacturing the ink jet head shown in FIG. 2.

Next, as shown in FIG. 8B, the common electrode layers 112, the vibration layers 111, and the substrate 130 are cut along the respective second partition walls 102$b$ to obtain a plurality of members 133. Each of the members 133 includes the actuator part B, and the pressure chamber member A having a plurality of through-holes 101. The actuator part B is bonded to the pressure chamber member A.

Figure 9A:
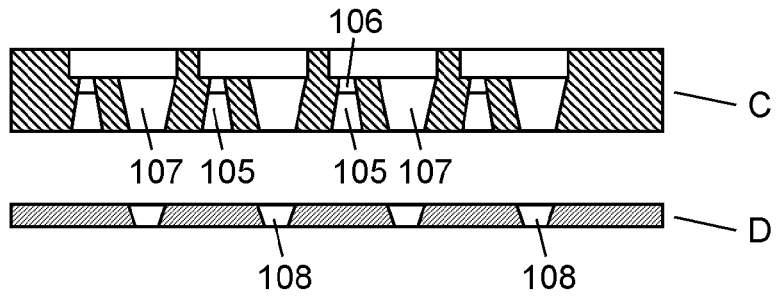
FIG. 9A is a cross-sectional view schematically showing a step of preparing an ink passage member and a nozzle plate in the example of the method of manufacturing the ink jet head shown in FIG. 2.

Apart from the above processes, as shown in FIG. 9A, the ink passage member C including the common liquid chambers 105, the supply ports 106, and the ink passages 107, and the nozzle plate D including the nozzle holes 108 are prepared.

Figure 9B:
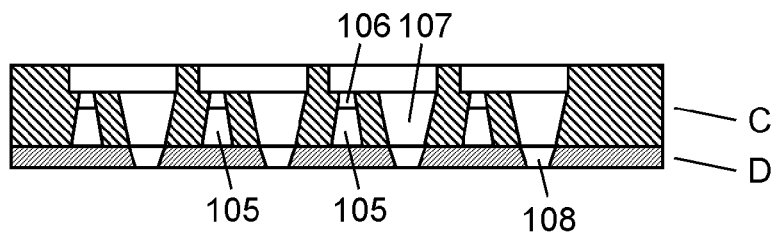
FIG. 9B is a cross-sectional view schematically showing a step of bonding the ink passage member and the nozzle plate in the example of the method of manufacturing the ink jet head shown in FIG. 2.

Next, as shown in FIG. 9B, the ink passage member C is bonded to the nozzle plate D so that the ink passages 107 are aligned over the corresponding nozzle holes 108 when viewed from the direction perpendicular to the main surface of the ink passage member C. Thus, a combined member is obtained. Preferably, the entire nozzle hole 108 is exposed from the ink passage 107. The bonding method is not limited. For example, an adhesive can be used.

Figure 9C:
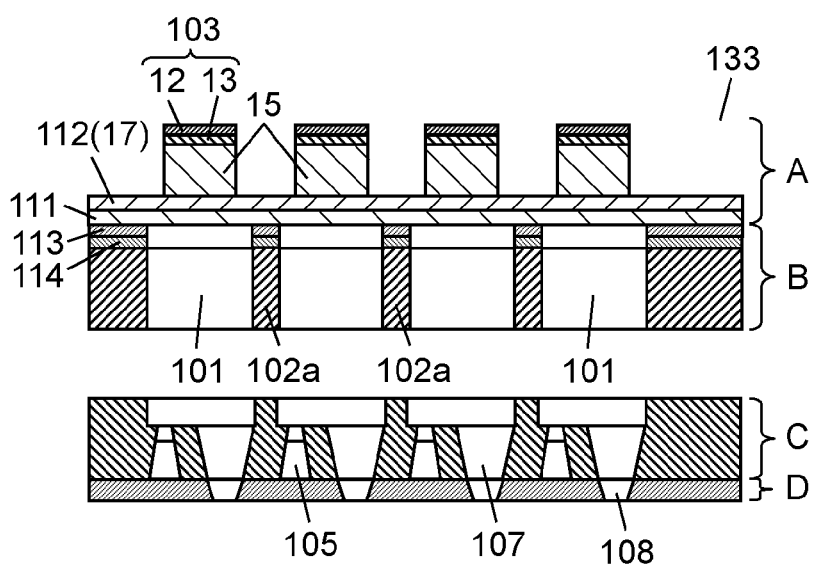
FIG. 9C is a cross-sectional view schematically showing a step of bonding a combined member of the actuator part and the pressure chamber member and a combined member of the ink passage member and the nozzle plate in the example of the method of manufacturing the ink jet head shown in FIG. 2.
Figure 9D:
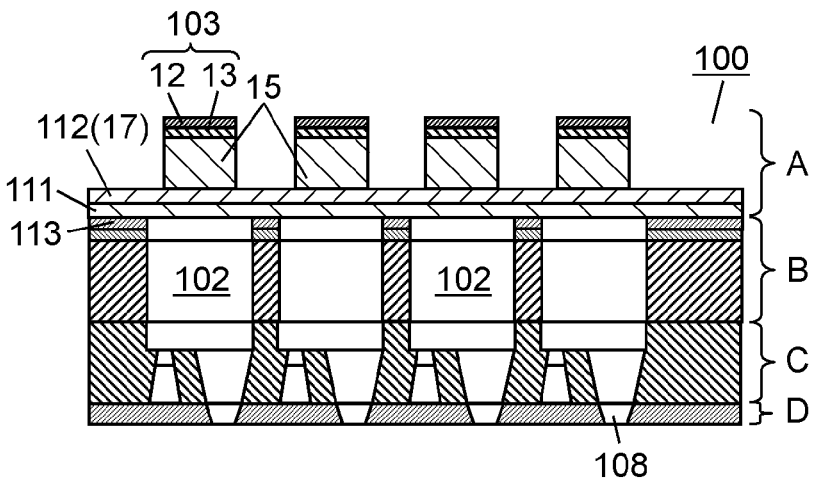
FIG. 9D is a cross-sectional view schematically showing an ink jet head obtained by the steps shown in FIG. 5A to FIG. 9C.

Then, as shown in FIG. 9C, the member 133 is bonded to the combined member prepared in the step shown in FIG. 9B. More particularly, the surface of the pressure chamber member A opposite to the actuator part B is bonded to the surface of the ink passage member C opposite to the nozzle plate D. When they are bonded, their alignment is adjusted, and thus this bonding allows the through-holes 101 to serve as the pressure chambers 102. The bonding method is not limited, and for example, an adhesive is used. In this manner, the ink jet head 100 shown in FIG. 9D (FIG. 2) is obtained.

Figure 11:
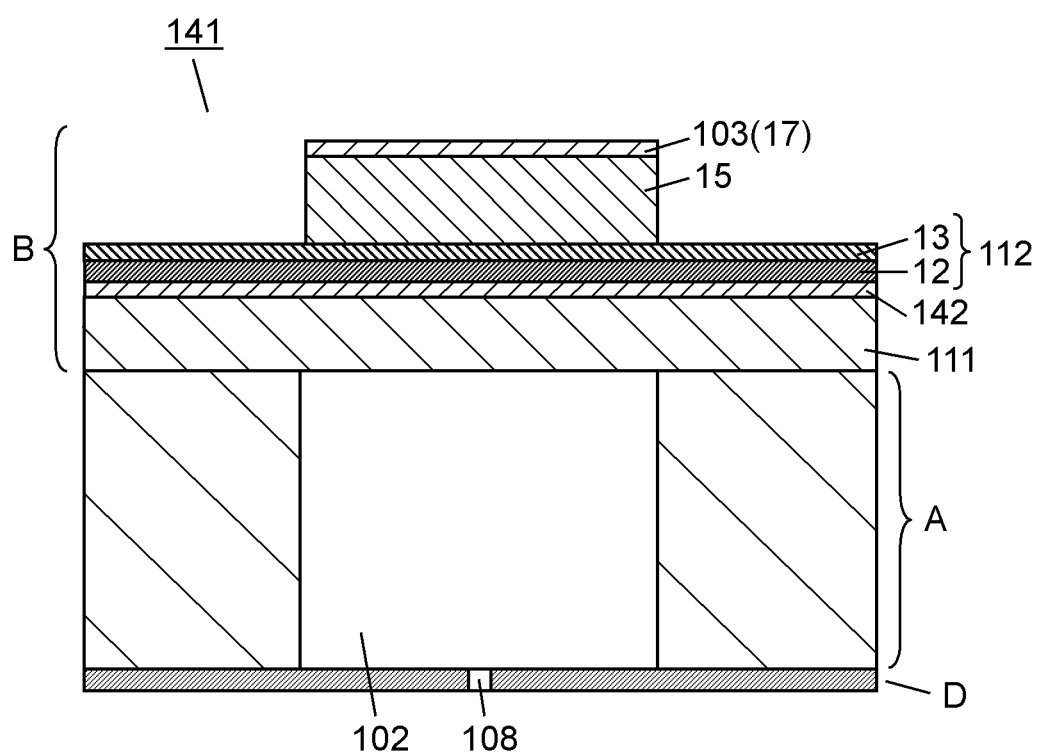
FIG. 11 is a cross-sectional view schematically showing another example of the ink jet head of the present invention.

FIG. 11 shows another ink jet head of the present invention. An ink jet head 141 shown in FIG. 11 has a simpler structure than the ink jet head 100 shown in FIG. 2 to FIG. 4. Particularly, the ink passage member C is removed from the ink jet head 100.

The ink jet head 141 shown in FIG. 11 is the same as the ink jet head 100 shown in FIG. 2 to FIG. 4 except the following points (1) to (6): (1) the ink passage member C is not included, and the nozzle plate D having the nozzle holes 108 is bonded directly to the pressure chamber member A; (2) the intermediate layer 113 is not included, and the vibration layer 111 is bonded directly to the pressure chamber member A; (3) an adhesive layer 142 is disposed between the vibration layer 111 and the common electrode layer 112 to improve the adhesion therebetween; (4) the common electrode layer 112 is the electrode film 13; (5) the individual electrode layer 103 is composed of a conductive material; and (6) the common electrode layer 112 (the electrode film 13), the $(Na,Bi)TiO_3$—$BaTiO_3$ film 15, and the individual electrode layer 103 are laminated in this order from the side of the common electrode layer 112.

The common electrode layer 112 serves as the first electrode. The individual electrode layer 103 serves as the second electrode. The material of the adhesive layer 142 is, for example, Ti.

Figure 12A:
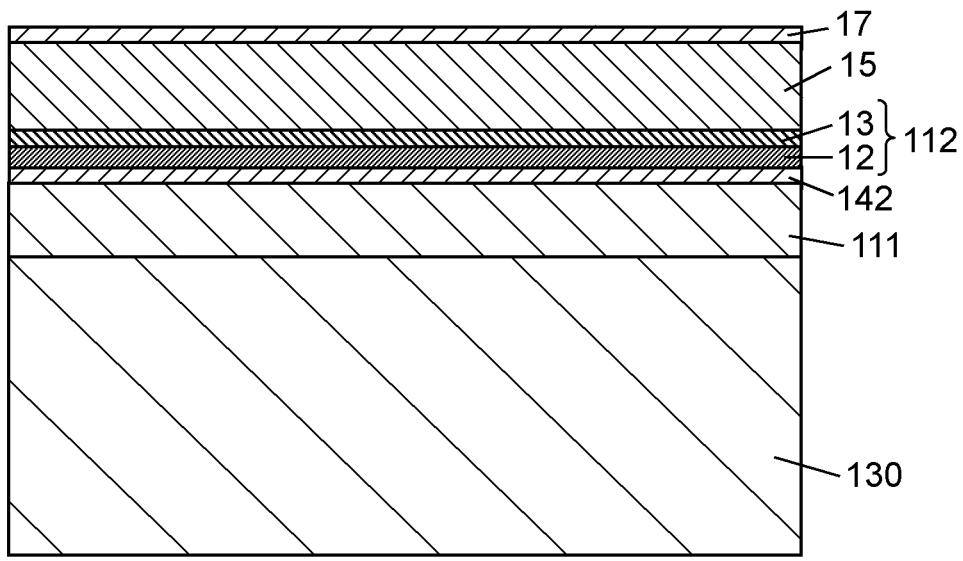
FIG. 12A is a schematic cross-sectional view for explaining the example of the method of manufacturing the ink jet head shown in FIG. 11.
Figure 12B:
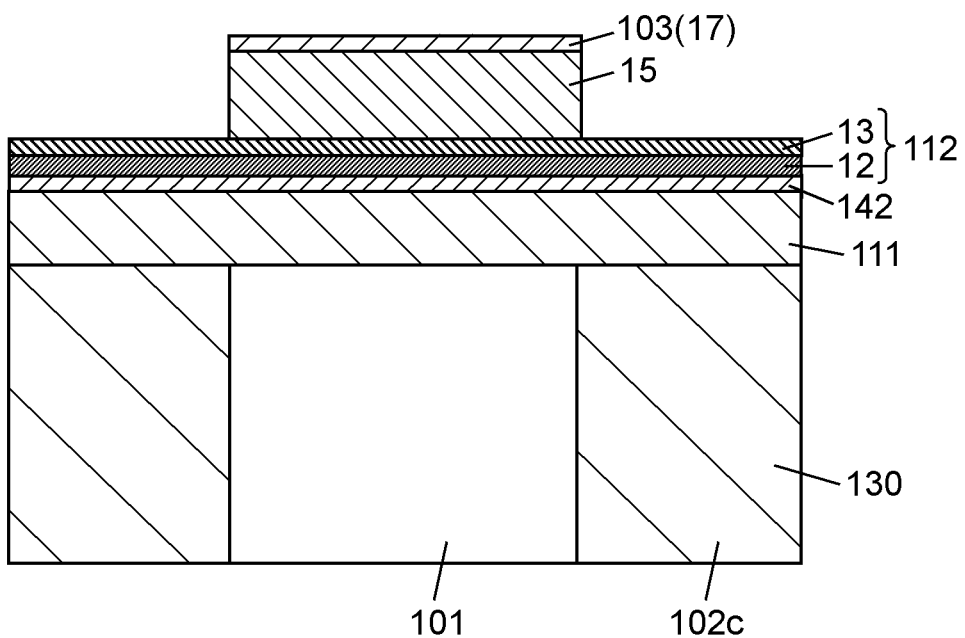
FIG. 12B is a schematic cross-sectional view for explaining the example of the method of manufacturing the ink jet head shown in FIG. 11.

The ink jet head 141 shown in FIG. 11 can be manufactured, for example, by a method shown in FIG. 12A and FIG. 12B. First, as shown in FIG. 12A, the vibration layer 111, the adhesive layer 142, the common electrode layer 112 (the electrode film 13), the $(Na,Bi)TiO_3$—$BaTiO_3$ film 15, and the electrode layer 131 are formed in this order on one of the main surfaces of the substrate 130. The method for forming each layers (films) are described above. The sputtering method is preferable.

In this embodiment, if the substrate 130 is Si, the surface of the substrate is oxidized to form the vibration layer 111 composed of silicon dioxide. The vibration layer 111 may have a thickness of not less than 0.5 micrometers and not more than 10 micrometers.

Next, as shown in FIG. 12B, the through-hole 101 is formed at the position of the substrate 130 where the pressure chamber 102 is to be formed. The conductive film 17, the $(Na,Bi)TiO_3$—$BaTiO_3$ film 15, and are subjected to microfabrication so that the center of the through-hole 101 coincides with the center of these films when viewed from the direction perpendicular to the main surface of the substrate 130. As a result of this microfabrication, the individual electrode layer 103 is formed from the conductive film 17. A well-known microfabrication technique like a combination of patterning and etching can be used for the formation of the through-hole 101 and the microfabrication of these respective layers. As etching, dry etching is preferred. Anisotropic dry etching is preferred for the formation of the through-hole 101. In dry etching, a gas mixture of argon and an organic gas containing fluorine atoms can be used. In the anisotropic dry etching, the gas mixture may contain sulfur hexafluoride gas.

Finally, the substrate 130 is bonded to the separately formed nozzle plate having the nozzle holes 108. Thus, the ink jet head 141 shown in FIG. 11 is obtained. When they are bonded, their alignment is adjusted so that this bonding allows the through-holes 101 to serve as the pressure chambers 102. The bonding method is not limited, and for example, an adhesive is used. The nozzle holes can be formed through the nozzle plate by a microfabrication method such as lithography method, laser processing method, or electric discharge method.

[Image Forming Method by Ink Jet Head]

The image forming method of the present invention includes, in the above-described ink jet head of the present invention, a step of applying a voltage to the piezoelectric layer through the first and second electrodes (that is, the individual electrode layer and the common electrode layer) to displace, based on the piezoelectric effect, the vibration layer in its film thickness direction so that the volumetric capacity of the pressure chamber changes; and a step of ejecting the ink from the pressure chamber by the displacement.

The voltage to be applied to the piezoelectric layer is changed with the relative position between the ink jet head and an object like a sheet of paper, on which an image is to be formed, being changed, so as to control the timing of ink ejection from the ink jet head and the amount of ink ejected therefrom. As a result, an image is formed on the surface of the object. The term "image" used in the present description includes a character. In other words, according to the present method for forming an image, a letter, a picture, or a figure is printed to an print target such as a paper.

[Angular Velocity Sensor]

Figure 13A:
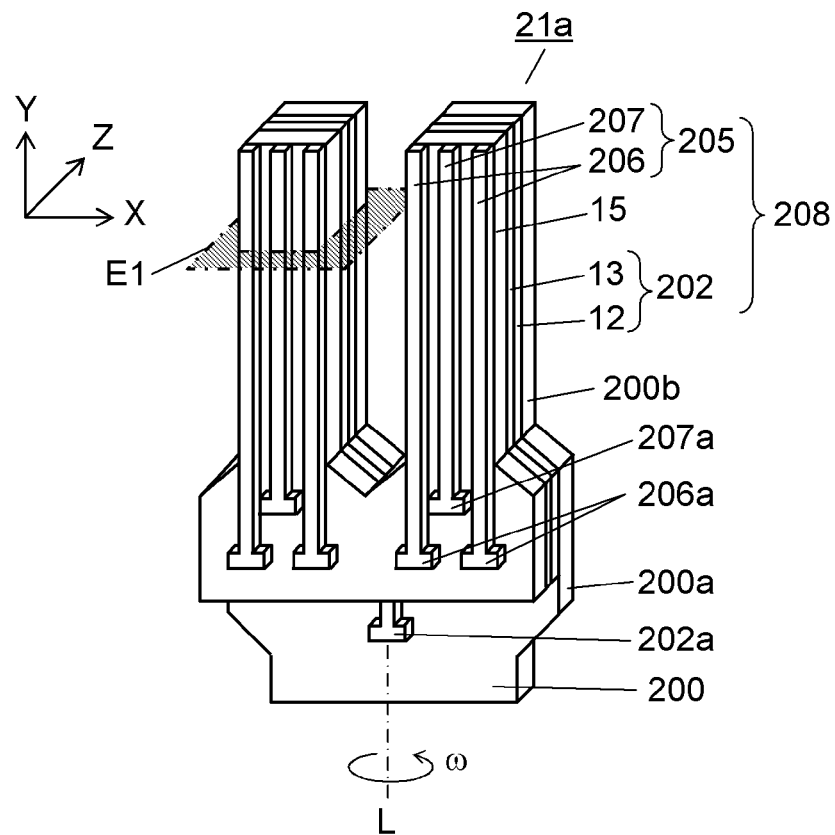
FIG. 13A is a perspective view schematically showing an example of an angular velocity sensor of the present invention.
Figure 13B:
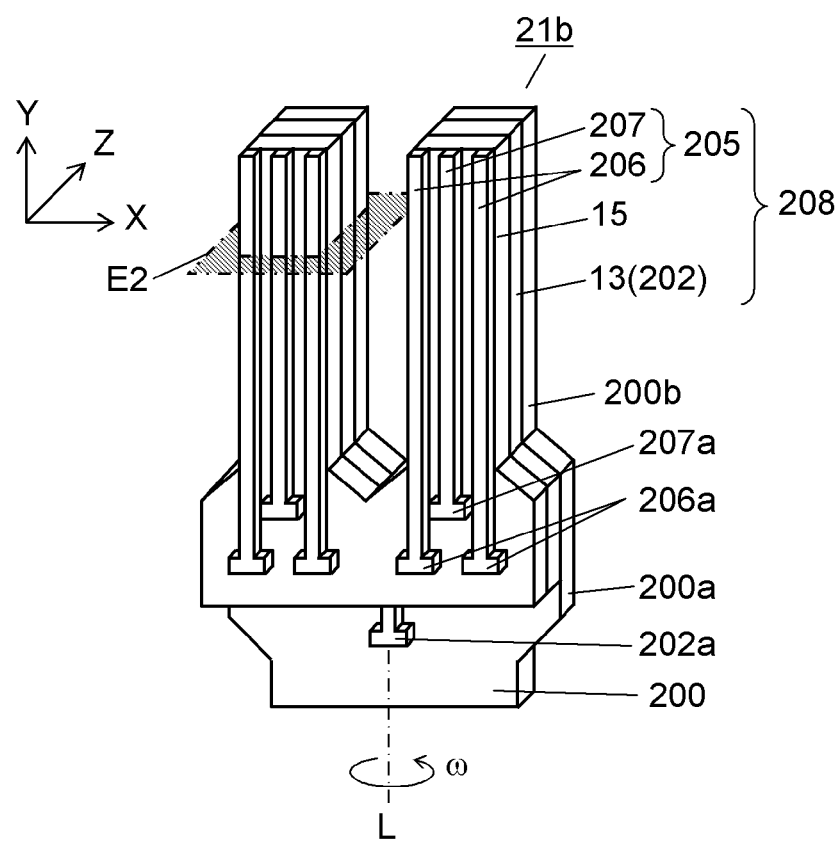
FIG. 13B is a perspective view schematically showing another example of the angular velocity sensor of the present invention.
Figure 14A:
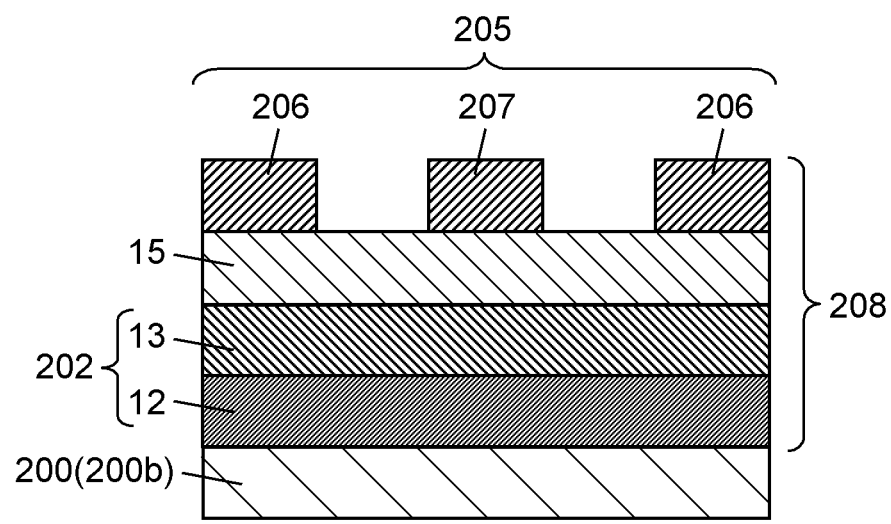
FIG. 14A is a cross-sectional view showing a cross section E1 of the angular velocity sensor shown in FIG. 13A.
Figure 14B:
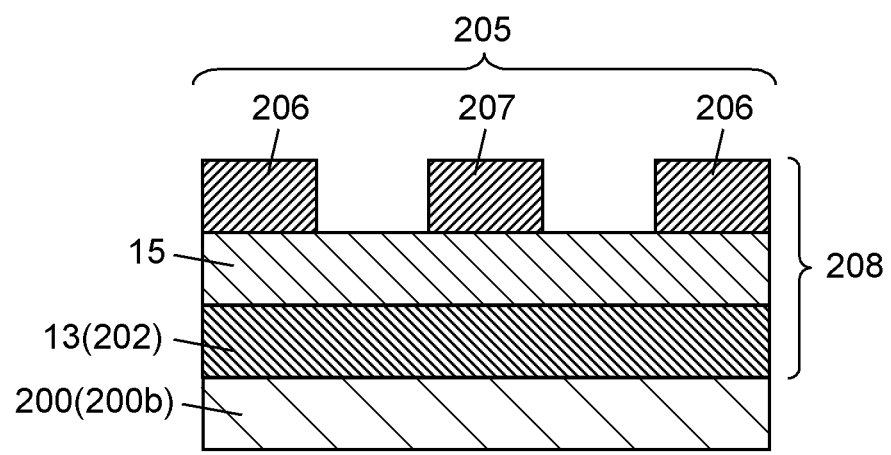
FIG. 14B is a cross-sectional view showing a cross section E2 of the angular velocity sensor shown in FIG. 13B.

FIG. 13A, FIG. 13B, FIG. 14A, and FIG. 14B show examples of an angular velocity sensor of the present invention. FIG. 14A shows a cross section E1 of an angular velocity sensor 21a shown in FIG. 13A. FIG. 14B shows a cross section E2 of an angular velocity sensor 21b shown in FIG. 13B. The angular velocity sensors 21a and 21b shown in FIG. 13A to FIG. 14B are so-called tuning-fork type angular velocity sensors. This type of angular velocity sensor can be used in a navigation apparatus for a vehicle, and as a sensor for correcting image blurring due to hand movement in a digital still camera.

The angular velocity sensors 21a and 21b shown in FIG. 13A to FIG. 14B each include a substrate 200 having vibration parts 200b and piezoelectric thin films 208 bonded to the vibration parts 200b.

The substrate 200 has a stationary part 200a and a pair of arms (vibration parts 200b) extending in a predetermined direction from the stationary part 200a. The direction in which the vibration parts 200b extend is the same as the direction in which the central axis of rotation L of the angular velocity detected by the angular velocity sensor 21 extends. Particularly, it is the Y direction in FIG. 13A and FIG. 13B. The substrate 200 has a shape of a tuning fork including two arms (vibration parts 200b), when viewed from the thickness direction of the substrate 200 (the Z direction in FIG. 13A and FIG. 13B).

The material of the substrate 200 is not limited. The material is, for example, Si, glass, ceramic, or metal. A monocrystalline Si substrate can be used as the substrate 200. The thickness of the substrate 200 is not limited as long as the functions of the angular velocity sensors 21a and 21b can develop. More particularly, the substrate 200 has a thickness of at least 0.1 mm but not more than 0.8 mm. The thickness of the stationary part 200a can be different from that of the vibration part 200b.

The piezoelectric thin film 208 is bonded to the vibration part 200b. The piezoelectric thin film 208 includes the (Na,Bi)TiO$_3$—BaTiO$_3$ film 15, the first electrode 202, and the second electrode 205. The (Na,Bi)TiO$_3$—BaTiO$_3$ film 15 is sandwiched between the first electrode 202 and the second electrode 205. The piezoelectric thin film 208 has a multilayer structure in which the first electrode 202, the (Na,Bi)TiO$_3$—BaTiO$_3$ film 15, and the second electrode 205 are laminated in this order. The piezoelectric layer 15 is interposed between the first electrode 202 and the second electrode 205. The piezoelectric thin film 208 has a multilayer structure where the (Na,Bi)TiO$_3$—BaTiO$_3$ film 15, the first electrode 202, and the second electrode 205 are stacked in this order.

In the piezoelectric thin film 208 shown in FIG. 13A and FIG. 14A, the first electrode 202 is a laminate of the metal electrode film 12 (preferably, a Pt film) and the electrode film 13. The electrode film 13 is in contact with the (Na,Bi)TiO$_3$—BaTiO$_3$ film 15. This piezoelectric thin film 208 has a multilayer structure in which the electrode film 13, the (Na,Bi)TiO$_3$—BaTiO$_3$ film 15, and the second electrode 205 are laminated in this order.

In the piezoelectric thin film 208 shown in FIG. 13B and FIG. 14B, the first electrode 202 is the electrode film 13. This piezoelectric thin film 208 has a multilayer structure in which the electrode film 13, the (Na,Bi)TiO$_3$—BaTiO$_3$ film 15, and the second electrode 205 are laminated in this order. That is, the piezoelectric thin film 208 shown in FIG. 13B and FIG. 14B is identical to the piezoelectric thin film 1c shown in FIG. 1C, in a case where the second electrode 205 deems to be the conductive film 17.

The electrode film 13, and the (Na,Bi)TiO$_3$—BaTiO$_3$ film 15 in each of the piezoelectric thin films 208 shown in FIG. 13A to FIG. 14B are the same as those in the piezoelectric thin film of the present invention that has been described above, including the preferred embodiments thereof.

The second electrode 205 can be made of, for example, a Cu electrode film. The Cu electrode is preferable for the second electrode 205 because of its excellent adhesion to the (Na,Bi)TiO$_3$—BaTiO$_3$ film 15. The second electrode 205 can be a Pt electrode or an Au electrode having, on its surface, an adhesive layer made of a conductive material. Since Ti has high adhesion to the (Na,Bi)TiO$_3$—BaTiO$_3$ film 15, it can be used as a material for the adhesive layer.

The second electrode 205 has an electrode group including a drive electrode 206 and a sense electrode 207. The drive electrode 206 applies a driving voltage that oscillates the vibration part 200b to the piezoelectric layer 15. The sense electrode 207 measures a deformation of the vibration part 200b caused by an angular velocity applied to the vibration part 200b. That is, the vibration part 200b usually oscillates in the width direction thereof (the X direction in FIG. 13A and FIG. 13B). More particularly, in FIG. 13A to FIG. 14B, a pair of drive electrodes 206 are provided on both of the width-direction edge portions of the vibration part 200b along the length direction thereof (the Y direction in FIG. 13A and FIG. 13B). Only one drive electrode 206 may be provided on one of the width-direction edge portions of the vibration part 200b. In FIG. 13A to FIG. 14B, the sense electrode 207 is provided along the length direction of the vibration part 200b and sandwiched between the pair of drive electrodes 206. A plurality of sense electrodes 207 may be provided on the vibration part 200b. The deformation of the vibration part 200b measured by the sense electrode 207 usually is a deflection in the thickness direction thereof (the Z direction in FIG. 13A and FIG. 13B).

In the angular velocity sensor of the present invention, one of the first electrode and the second electrode selected therefrom can be composed of an electrode group including the drive electrode and the sense electrode. In each of the angular velocity sensors 21a and 21b shown in FIG. 13A to FIG. 14B, the second electrode 205 is composed of the electrode group. Unlike this angular velocity sensor, the first electrode 202 can be composed of the electrode group. As an example, the second electrode 205, the (Na,Bi)TiO$_3$—BaTiO$_3$ film 15, and the first electrode 202 (the first electrode includes the electrode film 13 that is in contact with the (Na,Bi)TiO$_3$—BaTiO$_3$ film 15) can be laminated in this order, when viewed from the substrate 200.

The first electrode 202, the drive electrode 206, and the sense electrode 207 have connection terminals 202a, 206a, and 207a, respectively, formed at the end portions thereof. The shape and position of each of the connection terminals are not limited. In FIG. 13A and FIG. 13B, the connection terminals are provided on the stationary part 200a.

Preferably, the first electrode 202 has a thickness of at least 0.05 micrometers but not more than 1 micrometer. It is preferable that the (Na,Bi)TiO$_3$—BaTiO$_3$ film 15 has a thickness of at least 0.5 micrometers but not more than 5 micrometers. It is preferable that the second electrode 205 has a thickness of at least 0.05 micrometers but not more than 0.5 micrometers.

In FIG. 13A to FIG. 14B, the piezoelectric thin film 208 is bonded to both the vibration part 200b and the stationary part 200a. The bonding state of the piezoelectric thin film 208 is not limited as long as the piezoelectric thin film 208 can oscillate the vibration part 200b and measure the deformation of the vibration part 200b. For example, the piezoelectric thin film 208 may be bonded only to the vibration part 200b.

The angular velocity sensor of the present invention may have two or more vibration part groups each consisting of a pair of vibration parts 200b. Such an angular velocity sensor serves as a biaxial or triaxial angular velocity sensor capable of measuring angular velocities with respect to a plurality central axes of rotation. The angular velocity sensors shown in FIG. 13A to FIG. 14B each have one vibration part group consisting of a pair of vibration parts 200b.

The angular velocity sensor of the present invention is manufactured, for example, by the following method using the above-mentioned piezoelectric thin film manufacturing method. The following method is used in the case where the first electrode 202 includes the metal electrode film 12. A person skilled in the art can apply the following method also to the case where the first electrode 202 does not include the metal electrode film 12.

First, the electrode film 13, the (Na,Bi)TiO$_3$—BaTiO$_3$ film 15, and the electrode layer are formed on the surface of a substrate (for example, a Si substrate) in this order. The above-mentioned thin film formation techniques can be employed to form the respective layers (and films). Each layers (films) can be formed by the above-mentioned method. The sputtering method is preferred.

Next, the electrode layer is patterned using a microfabrication technique to form the second electrode 205 including the drive electrode 206 and the sense electrode 207. Furthermore, the (Na,Bi)TiO$_3$—BaTiO$_3$ film 15, the electrode film 13, and the metal electrode film 12 are patterned using a microfabrication technique. Then, the substrate is patterned using the microfabrication technique to form the vibration part 200b. In this manner, the angular velocity sensor of the present invention can be manufactured.

The microfabrication technique is, for example, dry etching.

A transfer technique using a base substrate can be applied to the manufacture of the angular velocity sensor of the present invention. Particularly, the following method can be used, for example. First, the electrode film 13, the (Na,Bi)TiO$_3$—BaTiO$_3$ film 15, and the electrode layer are formed on the surface of a base substrate in this order. Next, the laminate thus formed is bonded to another new substrate so that the substrate and the electrode layer are in contact with each other. Next, the base substrate is removed by a well-known technique. Next, the respective layers (and films) are patterned using a microfabrication technique. Thus, the angular velocity sensor of the present invention can be manufactured. The laminate and the new substrate can be bonded together via, for example, an adhesive layer. The material for the adhesive layer is not limited as long as the laminate is bonded stably to the new substrate. More particularly, an acrylic resin adhesive, an epoxy resin adhesive, a silicone adhesive, or a polyimide adhesive can be used. In this case, it is preferable that the adhesive layer have a thickness of at least 0.2 micrometers but not more than 1 micrometers.

[Method of Measuring Angular Velocity By Angular Velocity Sensor]

The angular velocity measuring method of the present invention uses the angular velocity sensor of the present invention, and includes the steps of: applying a driving voltage to the piezoelectric layer to oscillate the vibration part of the substrate; and measuring a deformation of the vibration part caused by an angular velocity applied to the oscillating vibration part to obtain a value of the applied angular velocity. The driving voltage is applied between the drive electrode and one of the first electrode and the second electrode (the other electrode) that serves neither as the drive electrode nor as the sense electrode, and thus the driving voltage is applied to the piezoelectric layer. The sense electrode and the other electrode measure the deformation of the oscillating vibration part caused by the angular velocity.

Hereinafter, the angular velocity measuring method by the angular velocity sensors 21a and 21b shown in FIGS. 13A and 13B is described. A driving voltage having a frequency that resonates with the natural vibration of the vibration part 200b is applied to the (Na,Bi)TiO$_3$—BaTiO$_3$ film 15 through the first electrode 202 and the drive electrode 206 so as to oscillate the vibration part 200b. The driving voltage can be applied, for example, by grounding the first electrode 202 and changing the potential of the driving electrode 206 (in other words, the driving voltage is the potential difference between the first electrode 202 and the driving electrode 206). The angular velocity sensors 21a and 21b each include a pair of vibration parts 200b that are arranged in the form of the tuning fork. Usually, reverse (positive and negative) voltages are applied to the drive electrodes 206 provided on the respective vibration parts 200b of the pair. This allows the respective vibration parts 200b to oscillate in the mode in which they vibrate in the directions opposite to each other (the mode in which they vibrate symmetrically with respect to the central axis of rotation L shown in FIGS. 13A and 13B). In the angular velocity sensors 21a and 21b shown in FIGS. 13A and 13B, the vibration parts 200b oscillate in their width direction (the X direction). The angular velocity can be measured by oscillating only one of the pair of vibration parts 200b. For accurate measurement, however, it is preferable to oscillate both of the vibration parts 200b in the mode in which they vibrate in the directions opposite to each other.

When an angular velocity ω with respect to the central axis of rotation L is applied to the angular velocity sensor 21a or 21b in which the vibration parts 200b are oscillating, the vibration parts 200b are deflected respectively in their thickness direction (the Z direction) by Coriolis force. In the case where the respective vibration parts 200b are oscillating in the opposite direction mode, they are deflected in the opposite directions by the same degree. The piezoelectric thin film 15 bonded to the vibration part 200b is also deflected according to this deflection of the vibration part 200b. As a result, a potential difference is generated between the first electrode 202 and the sense electrode 207 in accordance with the deflection of the piezoelectric thin film 15, that is, the magnitude of the generated Coriolis force. The angular velocity ω applied to the angular velocity sensor 21a or 21b can be measured by measuring the magnitude of the potential difference.

The following relationship between a Coriolis force Fc and an angular velocity ω is satisfied:

$$Fc = 2mv\omega$$

where v is the velocity of the oscillating vibration part 200*b* in the oscillation direction, and m is the mass of the vibration part 200*b*. As shown in this equation, the angular velocity ω can be calculated from the Coriolis force Fc.

[Piezoelectric Generating Element]

Figure 15A:
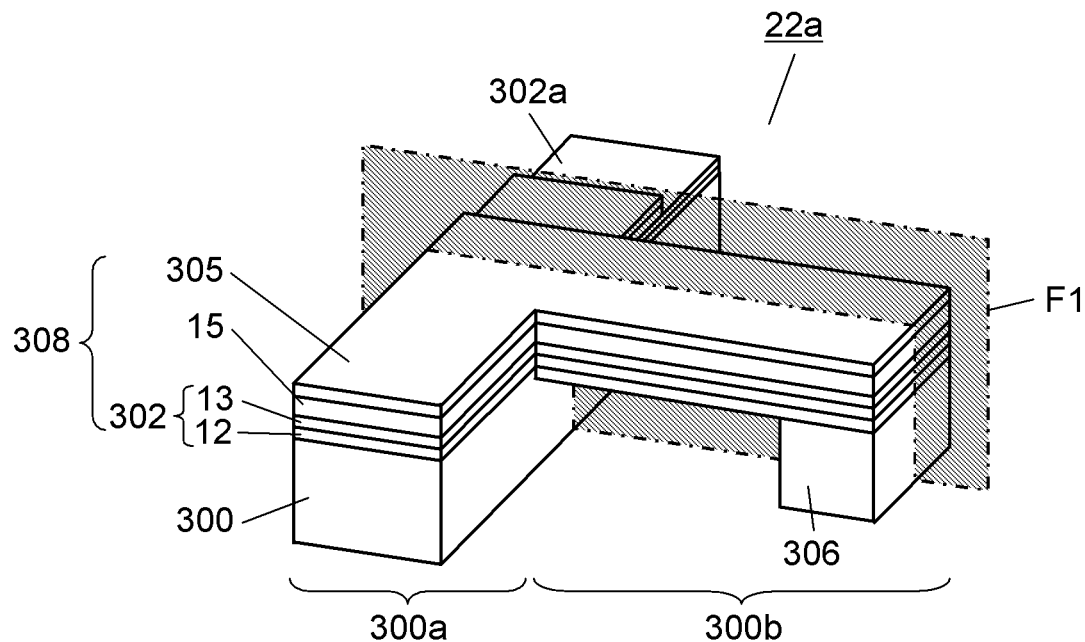
FIG. 15A is a perspective view schematically showing an example of a piezoelectric generating element of the present invention.
Figure 15B:
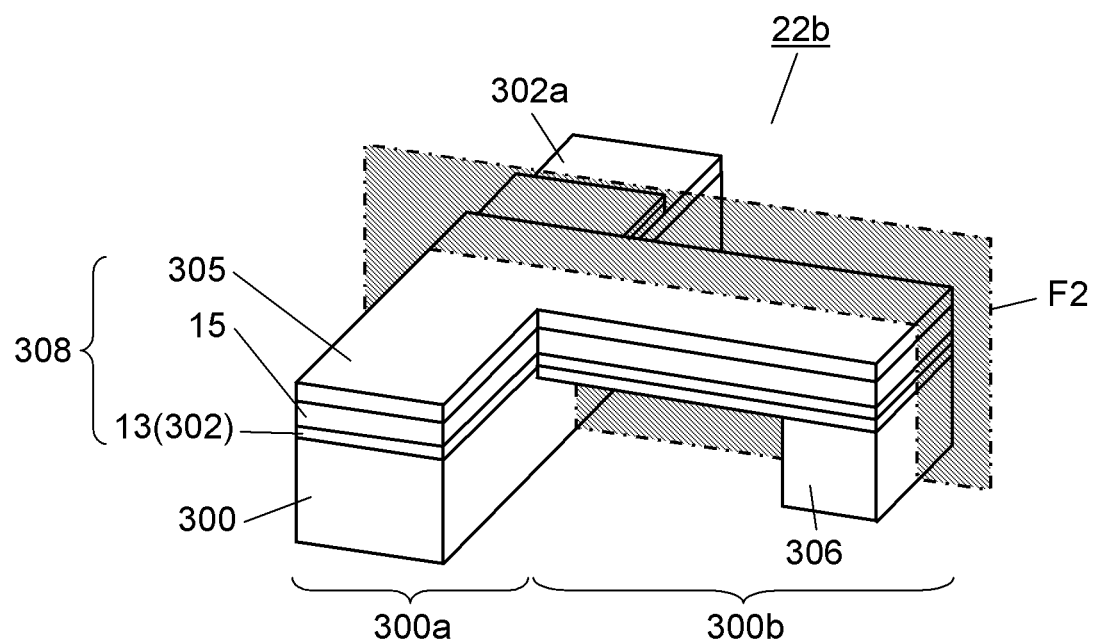
FIG. 15B is a perspective view schematically showing another example of the piezoelectric generating element of the present invention.
Figure 16A:
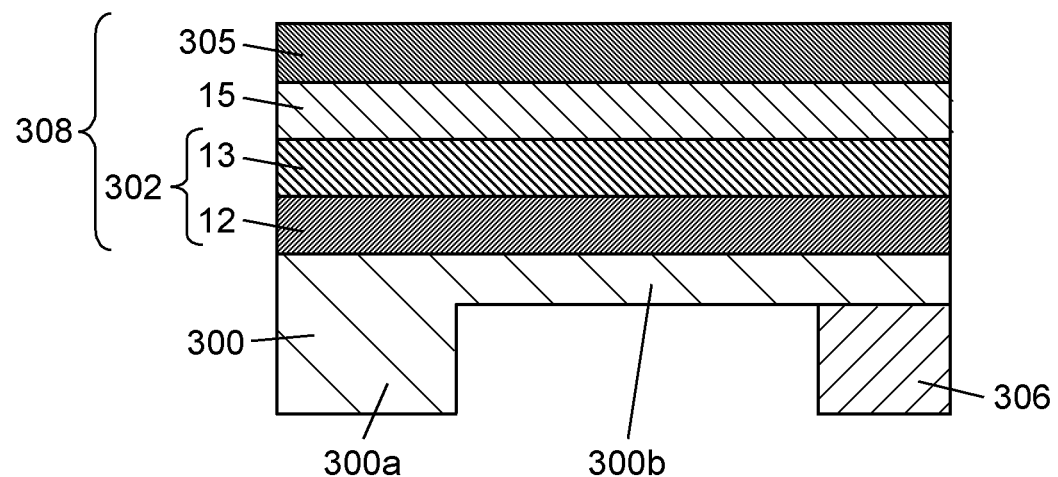
FIG. 16A is a cross-sectional view showing a cross section F1 of the piezoelectric generating element shown in FIG. 15A.
Figure 16B:
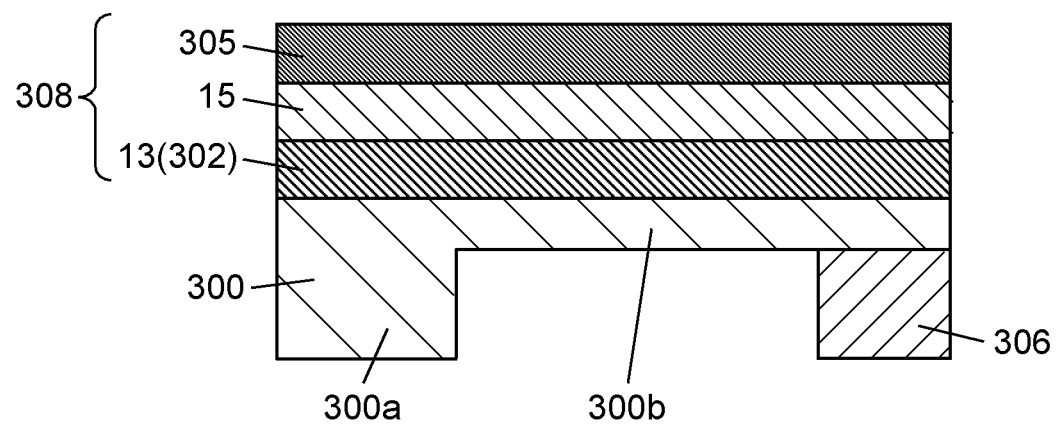
FIG. 16B is a cross-sectional view showing a cross section F2 of the piezoelectric generating element shown in FIG. 15B.

FIG. 15A, FIG. 15B, FIG. 16A, and FIG. 16B each show an example of the piezoelectric generating element of the present invention. FIG. 16A shows a cross section F1 of a piezoelectric generating element 22*a* shown in FIG. 15A. FIG. 16B shows a cross section F2 of a piezoelectric generating element 22*b* shown in FIG. 15B. The piezoelectric generating elements 22*a* and 22*b* are elements that convert externally-applied mechanical vibration into electrical energy. The piezoelectric generating elements 22*a* and 22*b* are applied suitably to a self-sustained power supply for generating electric power from various vibrations including engine vibrations and driving vibrations generated in vehicles and machines, and vibrations generated during walking.

The piezoelectric generating elements 22*a* and 22*b* shown in FIG. 15A to FIG. 16B each includes a substrate 300 having a vibration part 300*b* and a piezoelectric thin film 308 bonded to the vibration part 300*b*.

The substrate 300 has a stationary part 300*a*, and a vibration part 300*b* having a beam extending in a predetermined direction from the stationary part 300*a*. The material of the stationary part 300*a* can be the same as the material of the vibration part 300*b*. These materials may, however, be different from each other. The stationary part 300*a* and the vibration part 300*b* made of materials different from each other may be bonded to each other.

The material of the substrate 300 is not limited. The material is, for example, Si, glass, ceramic, or metal. A monocrystalline Si substrate can be used as the substrate 300. The substrate 300 has a thickness of, for example, at least 0.1 mm but not more than 0.8 mm. The stationary part 300*a* may have a thickness different from that of the vibration part 300*b*. The thickness of the vibration part 300*b* can be adjusted for efficient power generation by changing the resonance frequency of the vibration part 300*b*.

A weight load 306 is joined to the vibration part 300*b*. The weight load 306 adjusts the resonance frequency of the vibration part 300*b*. The weight load 306 is, for example, a vapor-deposited thin film of Ni. The material, shape, and mass of the weight load 306, as well as the position to which the weight load 306 is joined can be adjusted according to a desired resonance frequency of the vibration part 300*b*. The weight load may be omitted. The weight load is not necessary when the resonance frequency of the vibration part 300*b* is not adjusted.

The piezoelectric thin film 308 is bonded to the vibration part 300*b*. The piezoelectric thin film 308 includes the (Na,Bi)TiO₃—BaTiO₃ film 15, the first electrode 302, and the second electrode 305. The (Na,Bi)TiO₃—BaTiO₃ film 15 is sandwiched between the first electrode 302 and the second electrode 305. A piezoelectric thin film 308 has a multilayer structure in which the first electrode 302, the (Na,Bi)TiO₃—BaTiO₃ film 15, and the second electrode 305 are laminated in this order.

In the piezoelectric thin film 308 shown in FIG. 15A and FIG. 16A, the first electrode 302 is the electrode film 13. The electrode film 13 is in contact with the (Na,Bi)TiO₃—BaTiO₃ film 15. This piezoelectric thin film 308 has a multilayer structure in which the electrode film 13, the (Na,Bi)TiO₃—BaTiO₃ film 15, and the second electrode 305 are laminated in this order. That is, the piezoelectric thin film 308 shown in FIG. 15A and FIG. 16A is identical to the piezoelectric thin film 1*c* shown in FIG. 1B, when the second electrode 305 deems to be the conductive film 17.

In the piezoelectric thin film 308 shown in FIG. 15B and FIG. 16B, the first electrode 302 is the electrode film 13. This piezoelectric thin film 308 has a multilayer structure in which the electrode film 13, the (Na,Bi)TiO₃—BaTiO₃ film 15, and the second electrode 305 are laminated in this order. That is, the piezoelectric thin film 308 shown in FIG. 15B and FIG. 16B is identical to the piezoelectric thin film 1*c* shown in FIG. 1B, in a case where the second electrode 305 deems to be the conductive film 17.

The electrode film 13, and the (Na,Bi)TiO₃—BaTiO₃ film 15 in each of the piezoelectric thin films 308 shown in FIG. 15A to FIG. 16B are the same as those in the piezoelectric thin film of the present invention that has been described above, including the preferred embodiments thereof.

The second electrode 305 can be formed of, for example, a Cu electrode film. The Cu electrode is preferable for the second electrode 305 because of its excellent adhesion to the (Na,Bi)TiO₃—BaTiO₃ film 15. The second electrode 305 can be a Pt electrode film or an Au electrode having, on its surface, an adhesive layer made of a conductive material. Since Ti has high adhesion to the (Na,Bi)TiO₃—BaTiO₃ film 15, it can be used as a material for the adhesive layer.

In FIG. 15A to FIG. 16B, a part of the first electrode 302 is exposed. This part serves as a connection terminal 302*a*.

Preferably, the first electrode 302 has a thickness of at least 0.05 micrometers but not more than 1 micrometers. It is preferable that the (Na,Bi)TiO₃—BaTiO₃ film 15 has a thickness of at least 0.5 micrometers but not more than 5 micrometers. It is preferable that the second electrode 305 has a thickness of at least 0.05 micrometers but not more than 0.5 micrometers.

In FIG. 15A to FIG. 16B, the first electrode 302, the (Na,Bi)TiO₃—BaTiO₃ film 15, and the second electrode 305 are laminated in this order, when viewed from the substrate 300 having the vibration part 300*b*. The order of lamination of these layers may be reversed. That is, the second electrode, the (Bi,Na,Ba)TiO₃ film, and the first electrode (the first electrode includes the electrode film 13 that is in contact with the (Na,Bi)TiO₃—BaTiO₃ film 15) can be laminated in this order, when viewed from the substrate having the vibration part.

In FIG. 15A to FIG. 16B, the piezoelectric thin film 308 can be bonded to both of the vibration part 300*b* and the stationary part 300*a*. The piezoelectric thin film 308 can be bonded only to the vibration part 300*b*.

When the piezoelectric generating element of the present invention has a plurality of vibration parts 300*b*, an amount of a generated electric power can be increased. Such a piezoelectric generating element can be applied to mechanical vibrations containing a wide range of frequency components if the resonance frequencies of the plurality of vibration parts 300*b* are variable.

The piezoelectric generating element of the present invention is manufactured, for example, by the following method using the above-mentioned piezoelectric thin film manufacturing method.

First, the electrode film 13, the (Na,Bi)TiO₃—BaTiO₃ film 15, and the electrode layer are formed on the surface of a substrate (for example, a Si substrate) in this order. The above-mentioned thin film formation techniques can be employed to form the respective layers (and films). Each layer (film) can be formed by the above-mentioned method. The sputtering method is preferable.

Next, the electrode layer is patterned using a microfabrication technique to form the second electrode 305. Furthermore, the (Na,Bi)TiO$_3$—BaTiO$_3$ film 15, The electrode film 13 is patterned using a microfabrication technique. The electrode film 13 and the metal electrode film 12 are thus patterned to form the connection terminal 302a in parallel. Then, the substrate is patterned using the microfabrication technique to form the stationary part 300a and the vibration part 300b. The piezoelectric generating element of the present invention can be manufactured in this manner. In the case where the resonance frequency of the vibration part 300b needs to be adjusted, the weight load 306 is bonded to the vibration part 300b by a well-known method.

The microfabrication technique is, for example, dry etching.

A transfer technique using a base substrate can be applied to the manufacture of the piezoelectric generating element of the present invention. Particularly, the following method can be employed, for example. First, the electrode film 13, the (Na,Bi)TiO$_3$—BaTiO$_3$ film 15, and the electrode layer are formed on the surface of a base substrate in this order. Next, the laminate thus formed is bonded to another new substrate so that the substrate and the electrode layer are in contact with each other. Next, the base substrate is removed by a well-known technique. Next, the respective layers (and films) are patterned using a microfabrication technique. Thus, the piezoelectric generating element of the present invention can be manufactured. The laminate and the new substrate can be bonded together via, for example, an adhesive layer. The material for the adhesive layer is not limited as long as the laminate is bonded stably to the new substrate. More particularly, an acrylic resin adhesive, an epoxy resin adhesive, a silicone adhesive, or a polyimide adhesive can be used. In this case, it is preferable that the adhesive layer has a thickness of at least 0.2 micrometers but not more than 1 micrometer.

[Method of Generating Electric Power Using Piezoelectric Generating Element]

The above-described piezoelectric generating element of the present invention is vibrated to obtain electric power through the first electrode and the second electrode.

When mechanical vibration is applied externally to the piezoelectric generating element 22a or 22b, the vibration part 300b starts vibrating to produce vertical deflection with respect to the stationary part 300a. The piezoelectric effect produced by this vibration generates an electromotive force across the (Na,Bi)TiO$_3$—BaTiO$_3$ film 15. As a result, a potential difference is generated between the first electrode 302 and the second electrode 305 that sandwich the piezoelectric layer 15 therebetween. The higher piezoelectric performance of the piezoelectric layer 15 generates a larger potential difference between the first and second electrodes. Particularly in the case where the resonance frequency of the vibration part 300b is close to the frequency of mechanical vibration to be applied externally to the element, the amplitude of the vibration part 300b increases and thus the electric power generation characteristics are improved. Therefore, the weight load 306 is preferably used to adjust the resonance frequency of the vibration part 300b to be close to the frequency of mechanical vibration applied externally to the element.

EXAMPLES

Hereinafter, the present invention is described in more detail with reference to examples. The present invention is not limited to the following examples.

Example 1

In this example, a piezoelectric thin film having a structure shown in FIG. 1E was fabricated. The piezoelectric thin film comprises the MgO substrate 11, the Pt electrode film 13, the (Na,Bi)TiO$_3$—BaTiO$_3$ film 15, and the conductive film 17 in this order. The fabrication procedure is as follows.

A Pt electrode film (with a thickness of 250 nm) having a (110) orientation was formed by RF magnetron sputtering on the MgO surface, having a plane orientation of (110), of a monocrystalline Si substrate. The Pt electrode film corresponds to the electrode film 13. The Pt electrode film was formed using a metallic Pt target in an argon (Ar) gas atmosphere under the film formation conditions of an RF power of 20 W and a substrate temperature of 500 degree Celsius.

Next, a (1-x)(Na,Bi)TiO$_3$-xBaTiO$_3$ film (with a thickness of 3.0 micrometers, x=0.03) was formed by RF magnetron sputtering on the surface of the Pt electrode film 13. This film corresponds to the (Na,Bi)TiO$_3$—BaTiO$_3$ film 15. This film was formed using a target having the above-mentioned composition in a mixed gas atmosphere of Ar and oxygen (with a flow ratio between Ar and O$_2$ of 50:50) under the film formation conditions of an RF power of 170 W and a substrate temperature of 650 degree Celsius.

The composition of the formed (1-x)(Na,Bi)TiO$_3$-xBaTiO$_3$ film 15 (x=0.03) was analyzed by energy dispersive X-ray spectrometry (SEM-EDX). In the measurement with use of the SEM-EDX, it was difficult to quantify a light element such as oxygen accurately, since the analysis accuracy of the light element was low. However, it was confirmed that the composition of Na, Bi, Ba, and Ti contained the (1-x)(Na,Bi)TiO$_3$-xBaTiO$_3$ film 15 was identical to the composition of the target.

The formed (1-x)(Na,Bi)TiO$_3$-xBaTiO$_3$ film 15 (x=0.03) was subjected to an X-ray diffraction analysis to analyze the crystal structure thereof. The X-ray diffraction analysis was carried out in such a manner that an X-ray beam was irradiated from over the (1-x)(Na,Bi)TiO$_3$-xBaTiO$_3$ film 15.

Figure 17:
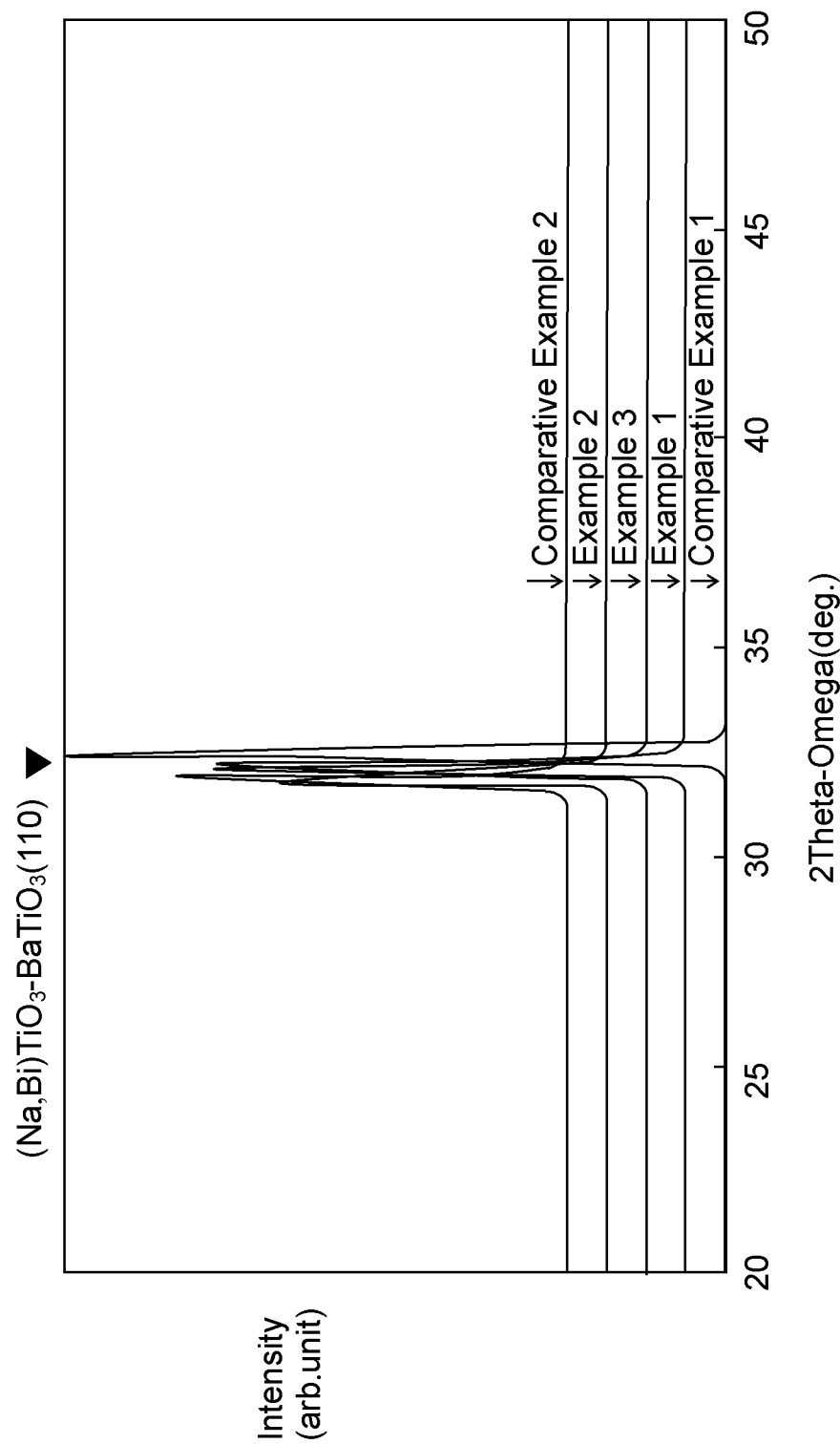
FIG. 17 is an X-ray diffraction profile of the piezoelectric films according to the examples 1-4 and the comparative examples 1-2.

FIG. 17 shows the result thereof, namely the 2Theta-Omega X-ray diffraction profile. In Comparative Examples below, X-ray diffraction analyses were carried out in the same manner. FIG. 17 shows not only the result of the X-ray diffraction according to the example 1, but also the results of the X-ray diffraction according to the examples 2-4 and the comparative examples 1-2.

FIG. 17 shows the results of the X-ray diffraction profile. Observed was only the reflection peak derived from the (110)-oriented (1-x)(Na,Bi)TiO$_3$-xBaTiO$_3$ film 15, except for the reflection peaks derived from the MgO substrate and the Pt electrode film. The intensity of the reflection peak was 725, 303 cps, which was a very high level. The profile shown in FIG. 17 means that the (1-x)(Na,Bi)TiO$_3$-xBaTiO$_3$ film 15 has a significantly high (110) orientation.

Figure 18:
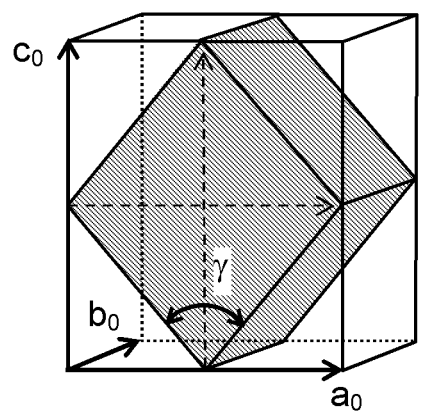
FIG. 18 shows a crystal structure of a piezoelectric material schematically.

Subsequently, the measurement of the reciprocal lattice map of the (Na,Bi)TiO$_3$—BaTiO$_3$ film 15 was performed. In the measurement of the reciprocal lattice map, a two-dimensional X-ray diffraction profile was measured by scanning movement of the incident angle omega of the X-ray to a sample and the diffraction angle 2·Theta of a detector. The lattice constant of the sample is calculated from the peak position of the measurement profile. The lattice constants ($a_o$, $c_o$, gamma) were calculated from the reciprocal lattice map in the neighborhood of the (310) and (130) of the (Na,Bi)TiO$_3$—BaTiO$_3$ film 15. Similarly, The lattice constant ($b_o$) was calculated from the reciprocal lattice map in the neighborhood of the (221) and (22-1) of the (Na,Bi)TiO$_3$—BaTiO$_3$ film 15. FIG. 18 shows an orthorhombic crystal lattice ($a_o$, $b_o$, $c_o$, gamma) schematically. Table 1 shows the lattice constant thereof. It was confirmed that the film according to the example 1 had an orthorhombic crystal structure.

Next, an Au electrode film with a thickness of 100 micrometers was formed by vapor deposition on the surface of the (Na,Bi)TiO$_3$—BaTiO$_3$ film 15. This Au electrode film corresponds to the conductive film 17. Thus, the piezoelectric thin film according to the example was prepared.

Using the Pt layer and the Au layer that the piezoelectric film includes, the piezoelectric performance of the piezoelectric thin film was evaluated in the following manner. The piezoelectric thin film was cut into a strip with a width of 2 mm (including the width of the Au electrode film) and worked into a cantilever shape. A potential difference was applied between the Pt electrode film and the Au electrode film, and the resulting displacement of the cantilever was measured with a laser displacement meter. The measured displacement was converted into a piezoelectric constant d$_{31}$ to evaluate the piezoelectric thin film. The piezoelectric constant d$_{31}$ of the piezoelectric thin film according to the example 1 was −101 pC/N, which was equivalent to the piezoelectric constant d$_{31}$ of a PZT film.

Example 2

An identical experiment to that of the example 1 was performed except that x was equal to 0.15.

As shown in FIG. 17 and Table 1, it was confirmed that the piezoelectric film according to the example 2 had an orthorhombic crystal structure, since it had strong intensity of a (110) reflection peak.

The piezoelectric constant d$_{31}$ of the piezoelectric thin film according to the example 2 was −136 pC/N, which was equivalent to the piezoelectric constant d$_{31}$ of a PZT film.

Example 3

An identical experiment to that of the example 1 was performed except that x was equal to 0.09.

As shown in FIG. 17 and Table 1, it was confirmed that the piezoelectric film according to the example 3 had an orthorhombic crystal structure, since it had strong intensity of a (110) reflection peak.

The piezoelectric constant d$_{31}$ of the piezoelectric thin film according to the example 3 was −175 pC/N, which was equivalent to the piezoelectric constant d$_{31}$ of a PZT film.

Example 4

An identical experiment to that of the example 3 was performed except that manganese was added at a concentration of 0.2 mol %.

As shown in Table 1, it was confirmed that the piezoelectric film according to the example 4 had an orthorhombic crystal structure, since it had strong intensity of a (110) reflection peak.

The piezoelectric constant d$_{31}$ of the piezoelectric thin film according to the example 4 was −217 pC/N, which was equivalent to the piezoelectric constant d$_{31}$ of a PZT film.

Comparative Example 1

An identical experiment to that of the example 1 was performed except that x was equal to 0.00.

As shown in FIG. 17 and Table 1, the piezoelectric film according to the comparative example 1 has stronger intensity of the (110) reflection peak than these of examples 1-4. However, it was confirmed that the piezoelectric film according to the comparative example 1 did not have an orthorhombic crystal structure, but pseudo-cubical crystal structure.

The piezoelectric constant d$_{31}$ of the piezoelectric thin film according to the comparative example 1 was −77 pC/N, which was not equivalent to the piezoelectric constant d$_{31}$ of a PZT film.

Comparative Example 2

An identical experiment to that of the example 1 was performed except that x was equal to 0.21.

As shown in FIG. 17 and Table 1, it was confirmed that the piezoelectric film according to the comparative example 2 had an orthorhombic crystal structure, since it had strong intensity of a (110) reflection peak.

However, the piezoelectric constant d$_{31}$ of the piezoelectric thin film according to the comparative example 2 was −58 pC/N, which was not equivalent to the piezoelectric constant d$_{31}$ of a PZT film.

The following table 1 and table 2 summarize the evaluation results of Examples and Comparative Examples.

TABLE 1

| | | Comparative Example 1 | Example 1 | Example 2 |
|---|---|---|---|---|
| Composition of the piezoelectric layer | Amount of BaTiO$_3$(x) | 0.00 | 0.03 | 0.15 |
| | Additive | — | — | — |
| Crystal Structure of the piezoelectric film | (110) Peak intensity (cps) | 1,031,053 | 725,303 | 648,972 |
| | a$_0$ | 0.5513 nm | 0.5506 nm | 0.5549 nm |
| | b$_0$ | 0.3892 nm | 0.3903 nm | 0.3906 nm |
| | c$_0$ | 0.5503 nm | 0.5520 nm | 0.5588 nm |
| | c$_0$/a$_0$ | 0.9982 | 1.0025 | 1.0070 |
| | gamma (degree) | 90.10 | 89.85 | 89.60 |
| | Orthorhombic Structure | Not obtained | Obtained | Obtained |
| Piezoelectric Constant d31 | | −77 pC/N | −101 pC/N | −136 pC/N |
| Evaluation | | Bad | Good | Good |

TABLE 2

| | | Comparative Example 2 | Example 3 | Example 4 |
|---|---|---|---|---|
| Composition of the piezoelectric layer | Amount of BaTiO$_3$(x) | 0.21 | 0.09 | 0.09 |
| | Additive | — | — | Mn |
| Crystal Structure of the piezoelectric film | (110) Peak intensity (cps) | 358,816 | 677,131 | 651,812 |
| | a$_0$ | 0.5567 nm | 0.5531 nm | 0.5529 nm |
| | b$_0$ | 0.3907 nm | 0.3905 nm | 0.3905 nm |
| | c$_0$ | 0.5618 nm | 0.5562 nm | 0.5559 nm |
| | c$_0$/a$_0$ | 1.0092 | 1.0056 | 1.0054 |
| | gamma (degree) | 89.49 | 89.72 | 89.70 |
| | Orthorhombic Structure | Obtained | Obtained | Obtained |
| Piezoelectric Constant d31 | | −58 pC/N | −175 pC/N | −217 pC/N |
| Evaluation | | Bad | Good | Excellent |

As shown in Table 1 and Table 2, the (1-x)(Na,Bi)TiO$_3$-x BaTiO$_3$ piezoelectric film with an orthorhombic crystal structure (x represents not less than 0.03 and not more than 0.15) has a high piezoelectric property, which is equivalent to that of a PZT film.

The example 2 and the comparative example 2 mean that x must not be over 0.15.

The example 1 and the comparative example 1 mean that x must not be less than 0.03.

The invention may be embodied in other forms without departing from the spirit or essential characteristics thereof. The embodiments disclosed in this specification are to be considered in all respects as illustrative and not limiting. The scope of the invention is indicated by the appended claims rather than by the foregoing description, and all changes which come within the meaning and range of equivalency of the claims are intended to be embraced therein.

INDUSTRIAL APPLICABILITY

The $(1-x)(Na,Bi)TiO_3$-$xBaTiO_3$ piezoelectric film with an orthorhombic crystal structure (x represents not less than 0.03 and not more than 0.15) has a high piezoelectric property, which is equivalent to that of a PZT film.

Since the $(1-x)(Na,Bi)TiO_3$-$xBaTiO_3$ piezoelectric film according to the present invention has a high piezoelectric constant $d_{31}$, the piezoelectric film according to the present invention is useful as a piezoelectric thin film alternative to existing lead-containing oxide ferroelectrics. The piezoelectric thin film of the present invention can be used suitably for applications such as pyroelectric sensors and piezoelectric devices in which piezoelectric thin films are used. Examples of such applications are the ink jet head, angular velocity sensor and piezoelectric generating element of the present invention.

The ink jet head of the present invention has excellent ink ejection characteristics although it does not contain a lead-containing ferroelectric material such as PZT. The method of forming an image by this ink jet head has high image forming accuracy and high expressivity. The angular velocity sensor of the present invention has high sensitivity although it does not contain a lead-containing ferroelectric material such as PZT. The method of measuring an angular velocity by this angular velocity sensor has excellent measurement sensitivity. The piezoelectric generating element of the present invention has excellent electric power generation characteristics although it does not contain a lead-containing ferroelectric material such as PZT. The electric power generation method of the present invention using this piezoelectric generating element has high electric power generation efficiency. The ink jet head, angular velocity sensor and piezoelectric generating element, and the image forming method, angular velocity measurement method and electric power generation method according to the present invention can be widely applied to various fields and uses.

REFERENCE MARK IN THE DRAWINGS 11 substrate
13 electrode film
15 $(1-x)(Na,Bi)TiO_3$-$xBaTiO_3$ film
17 conductive film
16a, 16c laminate structure
101 through-holes
102 pressure chambers
102 a walls
102 b walls
103 individual electrode layer
104 piezoelectric thin film
105 common liquid chambers
106 supply port
107 ink passage
108 nozzle hole
111 vibration layer
112 common electrode layer
113 intermediate layer
114 adhesive layer
120 base substrate
130 substrate
200 substrate
200a stationary part
200b vibration part
202 first electrode
205 second electrode
206 drive electrode
206a connection terminal
207 sense electrode
207a connection terminal
208 piezoelectric thin film
300 substrate
300a stationary part
300b vibration part
302 first electrode
305 second electrode
306 weight load
308 piezoelectric thin film

The invention claimed is:

1. A piezoelectric film comprising a laminate structure, wherein the laminate structure comprises an electric film and a $(1-x)(Na,Bi)TiO_3$-$xBaTiO_3$ film;
   x represents a value of not less than 0.03 and not more than 0.15;
   the $(1-x)(Na,Bi)TiO_3$-$xBaTiO_3$ film has a (110) surface orientation only; and
   the $(1-x)(Na,Bi)TiO_3$-$xBaTiO_3$ film has an orthorhombic crystal structure only.

2. The piezoelectric film according to claim 1, wherein the $(1-x)(Na,Bi)TiO_3$-$xBaTiO_3$ film contains manganese.

3. An ink jet head comprising:
   a piezoelectric thin film having a piezoelectric layer sandwiched between a first electrode and a second electrode;
   a vibration layer bonded to the piezoelectric thin film; and
   a pressure chamber member having a pressure chamber for storing ink and bonded to a surface of the vibration layer opposite to a surface to which the piezoelectric thin film is bonded,
   wherein the vibration layer is bonded to the piezoelectric thin film so that the vibration layer is displaceable in its film thickness direction according to a deformation of the piezoelectric thin film produced by a piezoelectric effect,
   the vibration layer and the pressure chamber member are bonded to each other so that a volumetric capacity of the pressure chamber changes according to a displacement of the vibration layer and so that the ink in the pressure chamber is ejected according to a change in the volumetric capacity of the pressure chamber,
   the piezoelectric layer is a $(1-x)(Na,Bi)TiO_3$-$xBaTiO_3$ film;
   x represents a value of not less than 0.03 and not more than 0.15;
   the $(1-x)(Na,Bi)TiO_3$-$xBaTiO_3$ film has a (110) surface orientation only; and
   the $(1-x)(Na,Bi)TiO_3$-$xBaTiO_3$ film has an orthorhombic crystal structure only.

4. The ink jet head according to claim 3, wherein the $(1-x)(Na,Bi)TiO_3$-$xBaTiO_3$ piezoelectric film contains manganese.

5. A method of forming an image by an ink jet head, the method comprising steps of:

(a) preparing the ink jet head, wherein
the ink jet head includes: a piezoelectric thin film having a piezoelectric layer sandwiched between a first electrode and a second electrode; a vibration layer bonded to the piezoelectric thin film; and a pressure chamber member having a pressure chamber for storing ink and bonded to a surface of the vibration layer opposite to a surface to which the piezoelectric thin film is bonded,
the vibration layer is bonded to the piezoelectric thin film so that the vibration layer is displaceable in its film thickness direction according to a deformation of the piezoelectric thin film produced by a piezoelectric effect,
the vibration layer and the pressure chamber member are bonded to each other so that a volumetric capacity of the pressure chamber changes according to a displacement of the vibration layer and so that the ink in the pressure chamber is ejected according to a change in the volumetric capacity of the pressure chamber,
the piezoelectric layer is a $(1-x)(Na,Bi)TiO_3$-$xBaTiO_3$ film;
x represents a value of not less than 0.03 and not more than 0.15;
the $(1-x)(Na,Bi)TiO_3$-$xBaTiO_3$ film has a (110) surface orientation only; and
the $(1-x)(Na,Bi)TiO_3$-$xBaTiO_3$ film has an orthorhombic crystal structure only; and (b) applying a voltage to the piezoelectric layer through the first electrode and the second electrode to displace, based on the piezoelectric effect, the vibration layer in its film thickness direction so that the volumetric capacity of the pressure chamber changes and the ink is ejected from the pressure chamber by the displacement.

6. The method according to claim 5, wherein the $(1-x)(Na,Bi)TiO_3$-$xBaTiO_3$ film contains manganese.

7. A method for fabricating a piezoelectric film, the method comprising:
(a) forming a $(1-x)(Na,Bi)TiO_{3-x}BaTiO_3$ film (x represents a value of not less than 0.03 and not more than 0.15) having only an orthorhombic crystal structure and only a (110) orientation by a sputtering method on an electric film.

8. The method according to claim 7, wherein the $(1-x)(Na,Bi)TiO_{3-x}BaTiO_3$ film contains manganese.

* * * * *